United States Patent [19]
Ohta et al.

[11] Patent Number: 6,017,784
[45] Date of Patent: Jan. 25, 2000

[54] MANUFACTURE METHOD OF SEMICONDUCTOR DEVICE WITH SUPPRESSED IMPURITY DIFFUSION FROM GATE ELECTRODE

[75] Inventors: Hiroyuki Ohta; Hidekazu Satoh, both of Kawasaki, Japan

[73] Assignee: Fujitsu Limited, Kawasaki, Japan

[21] Appl. No.: 08/870,293

[22] Filed: Jun. 6, 1997

[30] Foreign Application Priority Data

Jun. 9, 1996 [JP] Japan ................................. 8-236894

[51] Int. Cl.$^7$ .................... H01L 21/336; H01L 21/314
[52] U.S. Cl. .................. 438/197; 438/586; 438/624; 438/788; 438/792
[58] Field of Search ................................. 438/197, 199, 438/586, 624, 723, 724, 781, 787, 788, 791, 792

[56] References Cited

U.S. PATENT DOCUMENTS 4,863,755  9/1989  Hess et al. ............................. 427/574
5,424,253  6/1995  Usami et al. ........................... 438/762
5,550,091  8/1996  Fukuda et al. ...................... 204/192.23
5,567,661  10/1996  Nishio et al. .......................... 438/631

OTHER PUBLICATIONS

Wolf, S., Silicon Processing for the VLSI Era, vol. 2, Lattice Press, 1990, pp. 279–283.

*Primary Examiner*—T. N. Quach
*Attorney, Agent, or Firm*—Armstrong, Westerman, Hattori, McLeland, & Naughton

[57] ABSTRACT

A method of manufacturing a semiconductor device having fine MOS transistors includes a step of forming a MOS transistor structure on a semiconductor substrate, the MOS transistor structure having an insulated gate electrode, and a step of depositing an insulating film covering the insulated gate electrode over the semiconductor substrate, by parallel plate electrode plasma CVD using hydrogen-containing source gas under the conditions of a normalized RF power of 0.11 W/cm$^2$ to 0.85 W/cm$^2$ at the parallel plate electrode. A semiconductor device manufacture method is provided which can form fine MOS transistors of high reliability.

29 Claims, 21 Drawing Sheets

FIG.3A
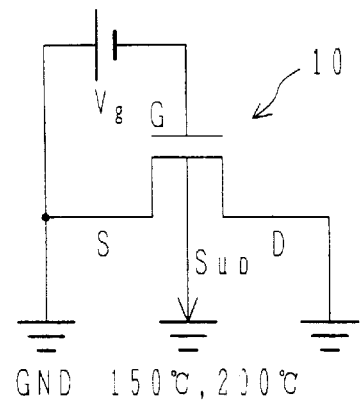
FIG.3B
| BT LIFETIME OF pMOSFET | Vd = 2.75V, 85°C | |
|---|---|---|
| RF Power<br>STANDARD OF LIFETIME | 1.36W/cm² (240W) | 0.28W/cm² (50W) |
| Id 3% | 1.25E + 4H | 3.1E + 5H |
Ta = 200°C
Vg = 3.3V
FIG.3C
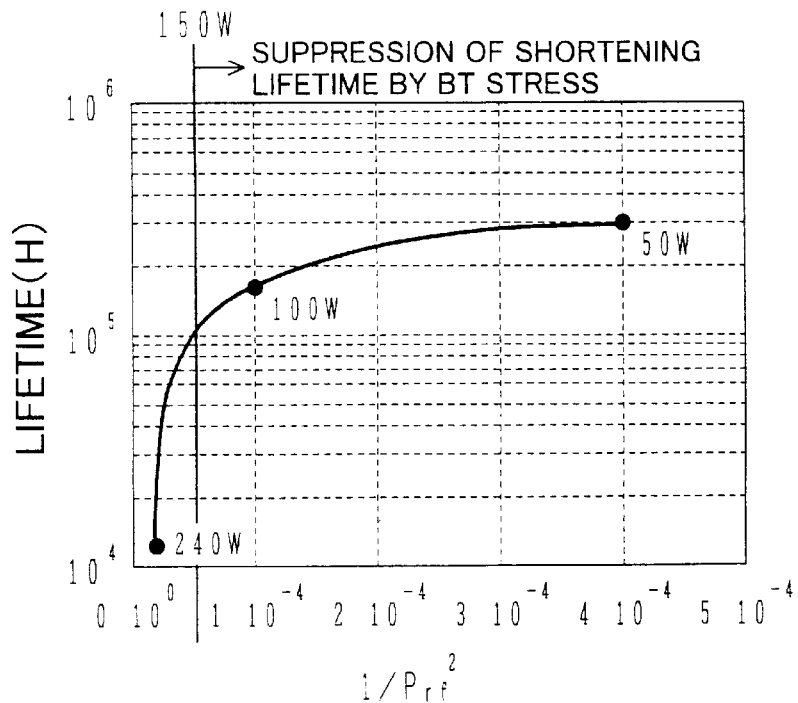

FIG.4A

| FLATBAND VOLTAGE OF pMOS CAPACITOR | | |
|---|---|---|
| RF Power / Flatband vol. | 240W | 50W |
| $V_{fb}(V)$ | 1.23V | 1.07V |

FIG.4B

| LIFETIME OF nMOSFET BY HOT CARRIERS | | |
|---|---|---|
| RF Power / STANDARD OF LIFETIME | 240W | 50W |
| 3% $I_d$ REDUCTION | 6E+4sec. | 5E+5sec. |

LIFETIME UNDER $I_{sub} = 1\,\mu m$

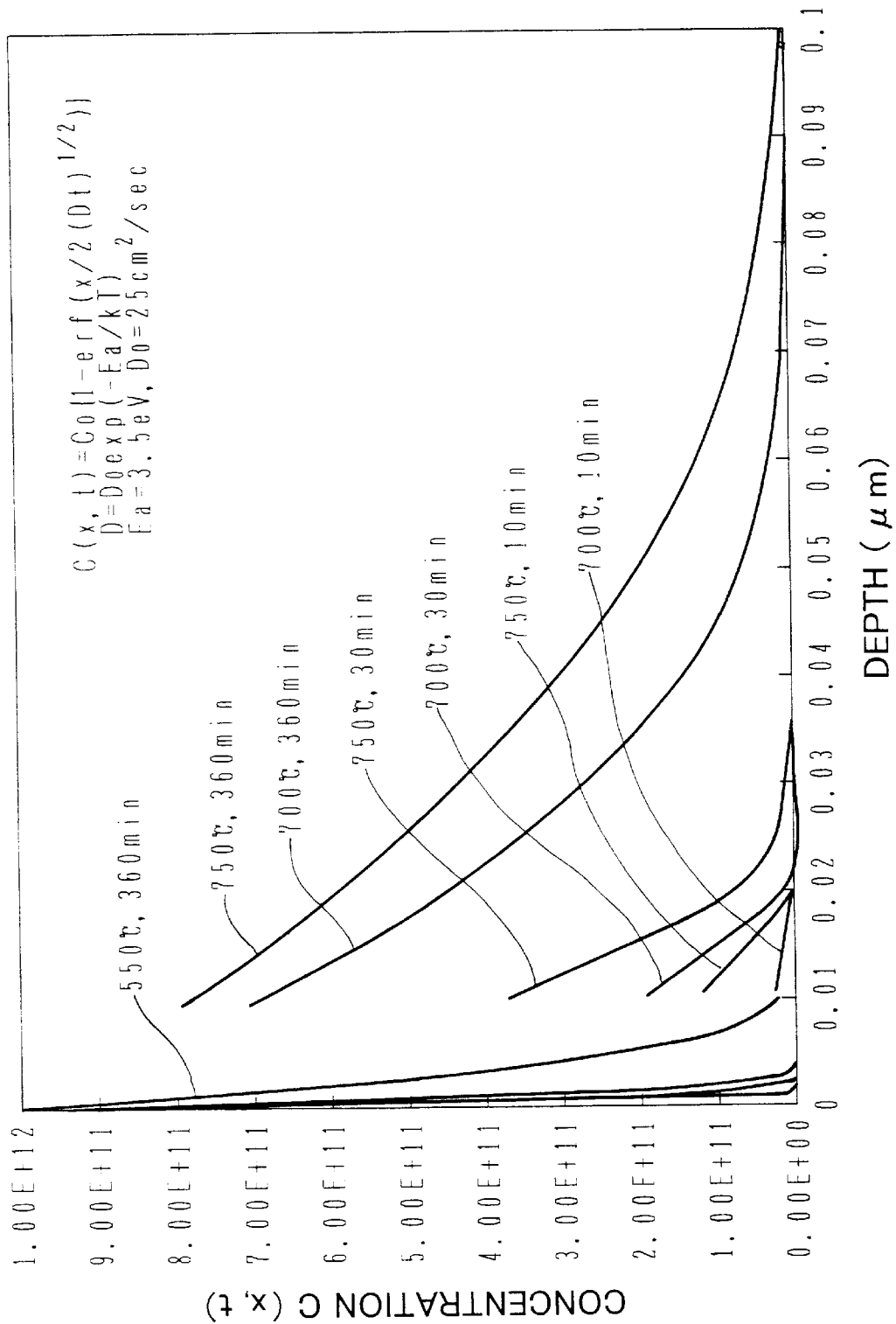

MANUFACTURE METHOD OF SEMICONDUCTOR DEVICE WITH SUPPRESSED IMPURITY DIFFUSION FROM GATE ELECTRODE

BACKGROUND OF THE INVENTION a) Field of the Invention

The present invention relates to a manufacture method of semiconductor devices, and more particularly to a manufacture method of semiconductor devices having fine MOS transistors.

b) Description of the Related Art

High integration and high speed are requisites for improvement on the performance of semiconductor integrated circuit devices. Therefore, MOS transistors which are typical semiconductor elements of integrated circuit devices are required to be made fine or small. Sizes of a MOS transistor are becoming small both in substrate surface and depth directions, e.g., a gate oxide film of 10 nm or thinner and a source-drain junction of 100 nm or shallower.

As MOS transistors are made fine, impurities are redistributed during thermal processes to cause the short channel effect (punch-through between the source and drain), or impurities in the gate electrode penetrate through the gate oxide film into the channel region. In order to solve these problems, it is generally required to use low temperature processes.

An interlayer or interlevel insulating film has been formed mostly by batch thermal CVD after a gate electrode and source/drain regions on both sides of the gate electrode are formed. To meet the need of low temperature processes, technology of forming an interlayer insulating film by plasma CVD (PECVD) or technology of forming it by single wafer processing type thermal CVD have been developed. It is sufficient for a substrate to be heated to about 300° C. to 550° C. during plasma CVD.

Dual-gate surface channel MOSFETs, with p-type impurities such as B being doped in the gate electrode of a p-channel transistor and n-type impurities such as P and As being doped in the gate electrode of an n-channel transistor, are now being used to realize high performance of CYMOS transistors.

In order to form a low resistance contact to a small area of a semiconductor surface, silicide (salicide) techniques are used to form in a self-alignment manner a silicide (salicide) layer on the surface of a source/drain region (in some cases, also on a gate electrode). Incorporation of silicide techniques limits the conditions of succeeding thermal processes. This limitation can be eliminated also by forming an interlayer insulating film by PECVD or single wafer processing type thermal CVD.

Formation of an interlayer insulating film by a low temperature process poses a problem of diffusion of moisture from the interlayer insulating film into a MOS transistor structure. An etch stopper (self-align contact (SAC)) is desired when a contact hole is etched through an interlayer insulating film to a source/drain region which uses silicide. To this end, technologies of forming a lamination structure of a thin nitride film and an oxide film formed on the nitride film, as an interlayer insulating film, have been developed in which both the nitride and oxide films are formed by PECVD or single wafer processing type thermal CVD or a combination of these CVD processes. The nitride film provides a moisture impermeable function and an etch stopper function.

Formation of an interlayer insulating film by PECVD or batch thermal CVD is associated with new problems such as an instable threshold voltage of p-channel MOSFET and shortening of a lifetime of a p-channel MOSFET in terms of BT (bias temperature) stress and a lifetime of an n-channel MOSFET in terms of hot carriers. These problems become critical issues when high reliability semiconductor integrated circuit devices are to be manufactured.

SUMMARY OF THE INVENTION

It is an object of the present invention to provide a manufacture method of semiconductor devices capable of being fabricated finely and providing high reliability.

It is another object of the present invention to provide a manufacture method of semiconductor devices capable of being fabricated at low temperature processes and providing high reliability.

According to one aspect of the present invention, there is provided a method of manufacturing a semiconductor device comprising the steps of: forming a MOS transistor structure on a semiconductor substrate, the MOS transistor structure having an insulated gate electrode; and depositing an insulating film covering the gate electrode over the semiconductor substrate, by parallel plate electrode plasma CVD using hydrogen-containing source gas under the conditions of a normalized RF power of 0.11 $W/cm^2$ to 0.85 $W/cm^2$ at the parallel plate electrode.

The insulating film covering the insulated gate electrode is deposited by plasma CVD with a limited RF power. Therefore, various problems associated with an insulating film formed by conventional batch thermal CVD or plasma CVD can be alleviated.

If an RF power is lowered, a film growth speed and film quality become bad. However, since the nitride film is not so thick and in a range of 20 nm to 100 nm (mostly, 50 nm to 70 nm), a low growth speed does not pose significant problems. Furthermore, since the nitride film as an etch stopper is not required to be strictly dense, the film quality does not cause much issue if the etching selection ratio is set sufficiently.

According to another aspect of the present invention, there is provided a method of manufacturing a semiconductor device comprising the steps of: forming a MOS transistor structure on a semiconductor substrate, the MOS transistor structure having an insulated gate electrode; depositing a nitride film covering the insulated gate electrode on the said semiconductor substrate, by single wafer processing type thermal CVD; and depositing an oxide film on the nitride film by plasma CVD or single wafer processing type thermal CVD.

As an insulating film covering the gate electrode, a lamination structure is used which is made of a nitride film formed by single wafer processing type thermal CVD and an oxide film on the nitride film formed by plasma CVD or single wafer processing type thermal CVD. Therefore, various problems associated with an insulating film formed by conventional batch thermal CVD or plasma CVD can be alleviated.

As above, a semiconductor device having MOSFETs capable of satisfying the need of low temperature processes and providing high reliability can be manufactured.

BRIEF DESCRIPTION OF THE OF DRAWINGS

FIGS. 3A to 3C are a diagram, a table, and a graph illustrating BT stress measurements and their results.

FIGS. 4A and 4B are tables showing flatband voltages of pMOS capacitors and lifetimes of n-MOSFETs shortened by hot carriers.

FIG. 12 is a graph showing distributions of B diffusion at different diffusion temperatures and times.

DETAILED DESCRIPTION OF THE PREFERRED EMBODIMENTS

Atomic or molecular hydrogen are said to permeate through an interlayer insulating film or its nearby components during a plasma CVD (PECVD) process. It is said that this hydrogen gives rise to adverse effects upon the transistor performance. Permeated hydrogen may increase the speed of diffusion of doped ions (particularly B ions) in a gate electrode or may generate detects in or at an interface of the gate oxide film. This phenomenon is conspicuous particularly in p-channel MOSFETs having gate electrodes doped with B.

As impurities doped in the gate electrode penetrate through the gate oxide film and diffuse into the channel region, the threshold voltage of MOSFET becomes unstable. Defects in or at the interface of the gate oxide film increase the rate of shortening a lifetime in terms of BT stress or hot carriers. These phenomena have been ascribed to permeation of hydrogen through an interlayer insulating film and its nearby components while the film is formed by a low temperature process.

The present inventors have studied on hydrogen in plasma in order to find any countermeasure to reduce a hydrogen amount permeated through a PECVD insulating film and adversely affecting device reliability.

Figure 1:
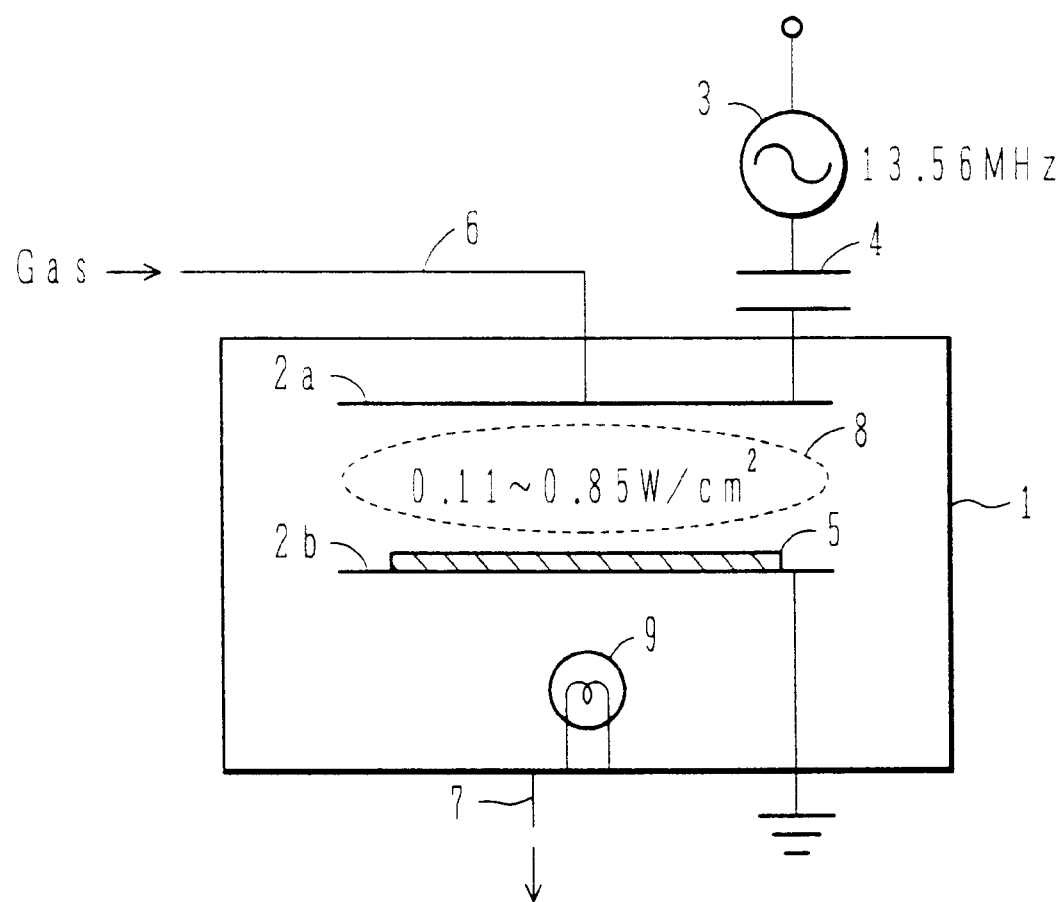
FIG. 1 is a cross sectional view schematically showing the structure of a plasma CVD system.

FIG. 1 is a schematic diagram showing the structure of a diode parallel plate plasma CVD system to be used for PECVD. Upper and lower parallel plate electrodes 2a and 2b are disposed in a vacuum chamber 1. The parallel plate electrodes 2a and 2b are 75 mm in radius and spaced by 600 mils (15.42 mm). A radio frequency (RF) power of 13.56 MHz is supplied from an RF power source 3 to the parallel plate electrodes 2a and 2b via a DC-cut capacitor 4.

Source gas is introduced from a gas supply pipe 6 into the upper electrode 2a and evacuated From an exhaust pipe 7 connected to the bottom or the vacuum chamber 1. As RF power is supplied from the RE power source 3 into the vacuum chamber 1 which is maintained at a predetermined vacuum degree (pressure) plasma 8 is generated between the parallel plate electrodes 2a and 2b. A lamp 9 heats the lower electrode 2b to heat a wafer 5 placed on the lower electrode 2b.

The inventors measured emission intensities of hydrogen related or originated species in the excited plasma 8 at different RF powers supplied from the RF power source 3.

Figure 2:
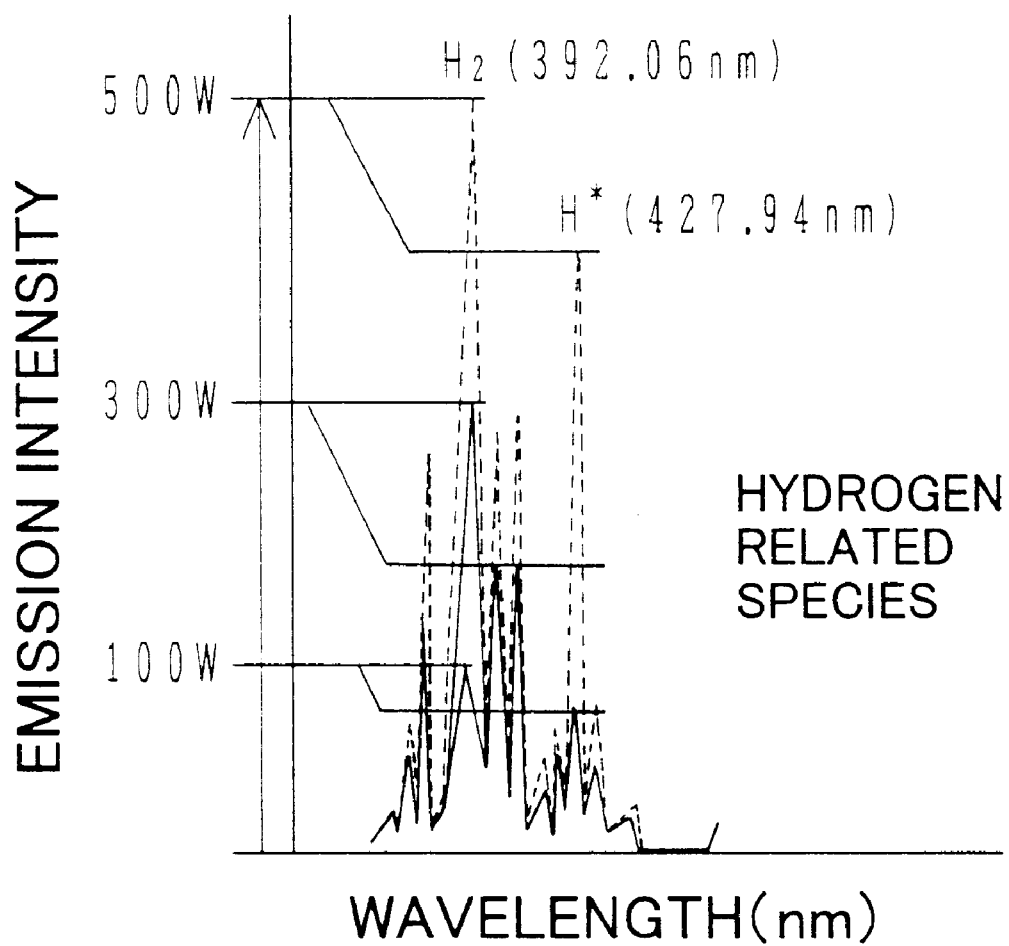
FIG. 2 is a graph showing emission spectra of hydrogen related or originated species.

FIG. 2 is a graph sowing emission intensities of hydrogen related species in plasma. The abscissa represents an emission wavelength in the unit of nm, an d the ordinate represents an emission intensity in an arbitrary unit. Emissions of hydrogen relate d species appear in the wavelength range of from 380 nm to 440 nm. FIG. 2 shows such emissions, particularly $H_2$ emission at a wavelength of 392.06 nm and H* (hydrogen radical) emission at a wavelength of 427.94 nm. Peaks of emission intensities at these two wavelengths are shown at different RF powers of 100 W, 300 W, and 500 W.

As seen from the graph, emissions of both $H_2$ and H* change depending on an Re power supplied to the plasma. It is therefore expected that as the RE power supplied to the plasma is lowered, the density of hydrogen related active species in the plasma lowers. From this viewpoint, interlayer insulating films were formed at different RF powers and the characteristics of obtained MOSFETs were examined.

FIGS. 3A to 3C illustrate BT stress tests and their results.

FIG. 3A illustratively shows how the BT stress test was made. A MOSFET 10 has an insulated gage electrode structure made of a lamination of a gate oxide film of 6 nm thick, a polysilicon gate electrode of 180 nm thick, a low temperature oxide film of 20 nm thick, and a nitride film of 70 nm thick. Nitride films were formed by PECVD at different RF powers. MOSFETs 10 were heated to bias temperatures of 150°, 200°, and etc. and source S, drain D, and substrate Sub were each connected to ground potential.

Under the above conditions, a bias gate voltage $V_g$ was applied between the gate G and the source S, drain D, and substrate Sub. The bias gate voltage $V_g$ was set to a value so that an electric field in the gate insulating film becomes about −5 MV/cm. For example, $V_g$ is −3.3 V. After such a stress was applied for a predetermined time period, each MOSFET 10 was cooled to the room temperature to measure its lifetime.

FIG. 3B shows the measured results of lifetimes of p-channel MOSFETs after such BT stress was applied. The stress temperature was 200° C., and the gate voltage was −3.3 V. The lifetime was defined as a period until a drain current $I_d$ changed by 3% while the substrate temperature was maintained at 85° C. and the drain D and gate G voltages were set to $V_d$, $V_g$=−2.75 V.

Lifetimes shown in the table of FIG. 3B were obtained by supplying RF powers of 240 W (1.36 W/cm$^2$) and 50 W (0.28 W/cm$^2$) across the parallel plate electrodes 2a and 2b while interlayer insulating films were formed. As compared to a supply of RF power of 240 W, the lifetime in terms of I$_d$ was prolonged by one digit at a supply of RF power of 50 W.

FIG. 3C shows lifetimes in terms of I$_d$ at different RF powers of 50 W, 100 W, and 240 W. The abscissa represents 1/P$_{rf}^2$ which is an inverse of a square of RF power P$_{rf}$, and the ordinate represents a lifetime in the unit of hour.

As seen from this graph, as the RF power increases from 50 W, to 100 W and to 240 W, a lifetime in terms of BT stress continues to shorten. A shortening rate of stress lifetime becomes large as the RF power exceeds 100 W, and as it increases over 150 W, the BT stress lifetime shortens considerably.

It can be judged from the above results that an RF power is preferably set to 150 W or lower. In other words, an RF power is preferably set to 0.85 W/cm$^2$, in terms of an RF power normalized by the plasma electrode area. If an RF power is set to 100 W or lower (0.57 W/cm$^2$, or lower). the lifetime is further stabilized.

If an RF power applied is set smaller than 20 W, plasma itself becomes difficult to be generated. 20 W corresponds to 0.11 W/cm$^2$ in terms of an RF power normalized by the electrode area. It is therefore preferable to set an RF power per electrode area to 0.11 W/cm$^2$ to 0.85 W/cm$^2$.

Typically, it is preferred to form an interlayer insulating film, particularly of silicon nitride, of a semiconductor device in a parallel plate electrode plasma-enhanced chemical vapor deposition at an RF (13.56 MHz) power of 0.11 to 0.85 W/cm$^2$.

As shown in FIGS. 3A to 3C, the BT stress lifetime was improved by lowering an RF power. It has been found that the electrical characteristics other than the BT stress lifetime can be improved by lowering an RF power.

FIGS. 4A and 4B show changes in a flatband voltage of a pMOS capacitor and in a lifetime of an n-channel MOSFET in terms of hot carriers.

FIG. 4A shows a difference between flatband voltages of a pMOS capacitor which is a MOS capacitor formed on p-type silicon, the difference depending upon manufacture conditions. In this table of FIG. 4A, the flatband voltages were measured by using an insulating film forming process under the conditions of RF powers of 50 W and 240 W, in an nitrogen atmosphere, and for 30 seconds at 800° C. The flatband voltage V$_{fb}$ was 1.23 V for an RF power of 240 W, and 1.07 V for an RF power of 50 W.

FIG. 4B shows lifetimes of n-channel MOSFETs in terms of hot carriers. In measuring the hot carrier lifetime, the bias voltage V$_g$ was applied between the gate electrode G and substrate Sub of a MOSFET in the manner similar to FIG. 3A, by setting the bias voltage V$_g$ so as to obtain a maximum substrate current Isub. The MOS transistor was turned on under the above conditions for a predetermined time period, and thereafter the lifetimes were measured.

In FIG. 4B, the lifetimes were obtained at a substrate current Isub of 1 μA/1 μm. The lifetime was defined as a time period until the drain current I$_d$ changed by 3%. The hot carrier lifetime for an RF power of 240 W was 6×10$^4$ seconds, whereas that for an RF power of 50 W was 5×10$^5$ seconds and was improved approximately by one digit.

Such phenomenon of prolonging lifetimes in terms of BT stress and hot carriers may be ascribed to a density of hydrogen related or originated active species in plasma reduced by a lower RF power. It can be presumed that if the density of hydrogen related active species in plasma is high, hydrogen related active species are implanted at high energy from the plasma into a deposited film or an underlying layer so that bonds such as Si—O—Si are broken and defects are formed.

Dangling bonds of these defects are temporarily remedied by coupling to hydrogen in an atmosphere or hydrogen during later annealing processes. However, if these terminating hydrogen atoms decouple by some reasons such as succeeding thermal processes and voltage applications, defects are again generated.

Dangling bonds may increase interface state density or may trap impurities to form fixed charges. Shortened lifetime may be ascribed to these causes. A defect generation rate is therefore presumed to be reduced if an RF power is lowered.

Figures 5A, 5B:
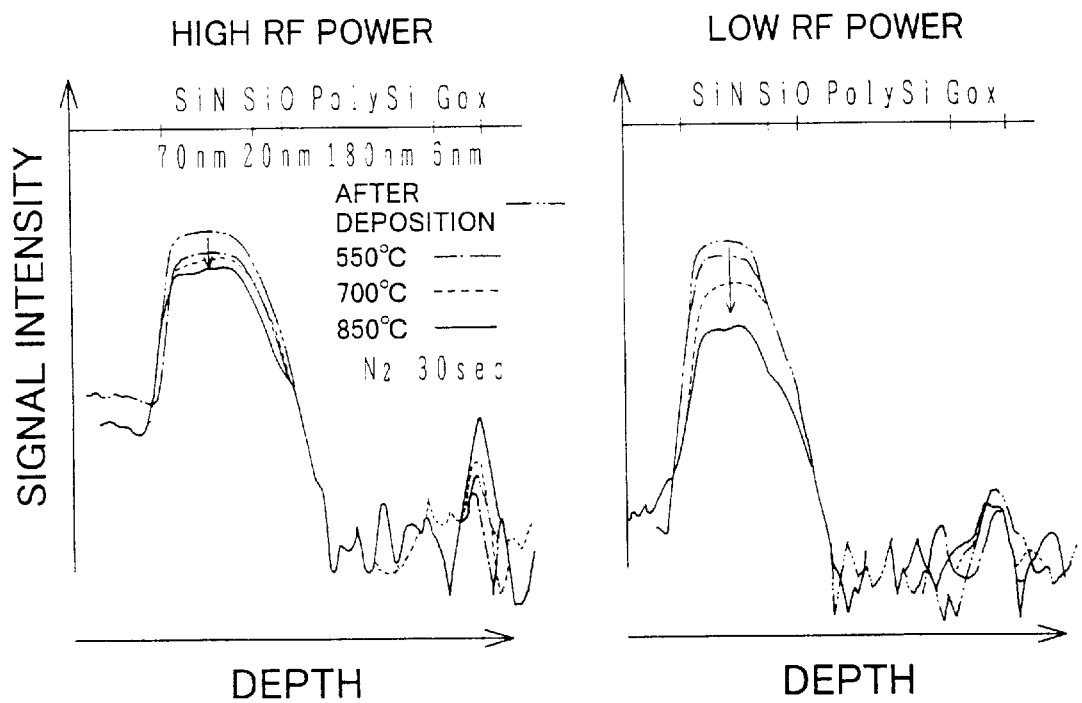
FIGS. 5A and 5B are graphs showing SIMS measurement results when a silicon nitride film is deposited at different RF powers and subjected to thermal processes.

FIGS. 5A and 5B show hydrogen distributions measured by secondary ion mass spectroscopy (SIMS), wherein interlayer insulating films were formed at RF powers of 240 W and 50 W and rapid thermal annealing (RTA) was performed for 360 seconds in a nitrogen atmosphere. FIG. 5A shows a hydrogen distribution in a sample formed with a high RF power (240 W), and FIG. 5B shows a hydrogen distribution in a sample formed with a low RF power (50 W). In FIGS. 5A and 5B, the abscissa represents a depth, and the ordinate represents a signal intensity of SIMS. The RTA process was performed at the temperatures of 550° C., 700° C., and 850° C. In FIGS. 5A and 5B, the highest curves indicate samples just after formation of interlayer insulating films without RTA, and the lower curves indicates samples subjected to RTA at the temperatures of 550° C., 700° C., and 850° C. in this order from the higher curves to the lower curves.

The hydrogen densities just after film formation are generally the same, irrespective of different RF powers used for film formation. However, with heat treatment after film formation, although the hydrogen density in the nitride film does not lower so much for the high RF power, the hydrogen density in the nitride film lowers considerably for the low RF power.

The hydrogen density in the gate oxide film Gox increases by the heat treatment in the case of the high RF power, whereas it is hardly changed by the heat treatment in the case of the low RF power.

With the high RF power, the hydrogen density in the nitride film hardly changes and that in the gate oxide film increases. With the low RF power, the hydrogen density in the nitride film is likely to lower and that in the gate oxide film hardly changes. The reason for this may be attributed to easy outer diffusion of hydrogen because of a low film density for the case of the low RF power.

Various adverse effects of the high RF power may occur because the hydrogen density in the gate oxide film is increased by the heat treatment after film formation. in contrast, improvements on various electrical characteristics can be expected in the case of low RF power, because the hydrogen density in the nitride film is lowered and that in the gate oxide film is not increased by the heat treatment, although the hydrogen density in the nitride film just after film formation cannot be neglected.

A manufacture method of n-channel MOSFETs according to an embodiment of this invention will be described with reference to FIGS. 6A to 6F.

Figure 6A:
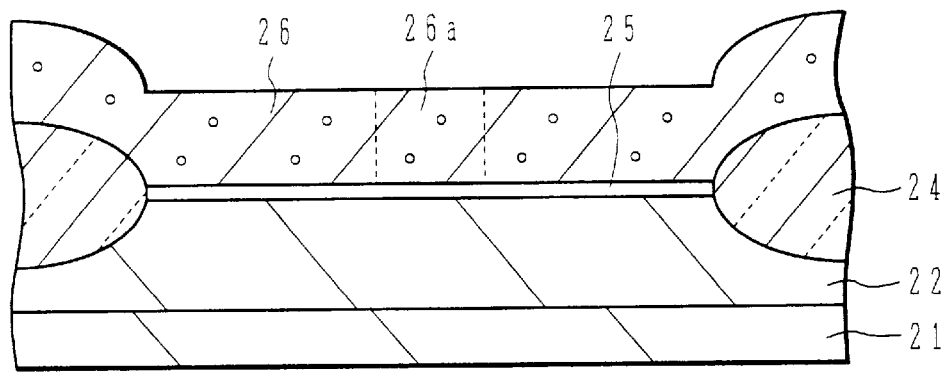
FIGS. 6A to 6F are cross sectional views illustrating main processes of a manufacture method of semiconductor devices with n-channel MOSFETs according to an embodiment of the invention.

As shown in FIG. 6A, after a p-type well 22 is formed in the surface area of a CZ silicon substrate 21 having the (100) plane, an element isolation or field oxide region 24 is formed by well know LOCOS. A gate oxide film 25 of about 6 nm thick is formed on the surface of the silicon substrate in the active region surrounded by the field oxide region 24. A polysilicon film 26 is deposited to a thickness of 200 nm by well known low pressure (LP) CVD, covering the gate oxide film 25, and phosphorous ions are implanted to lower resistance of the polysilicon film 26. Thereafter, the polysilicon film 26 is selectively etched by using photolithography to form a gate electrode 26a.

Figure 6B:
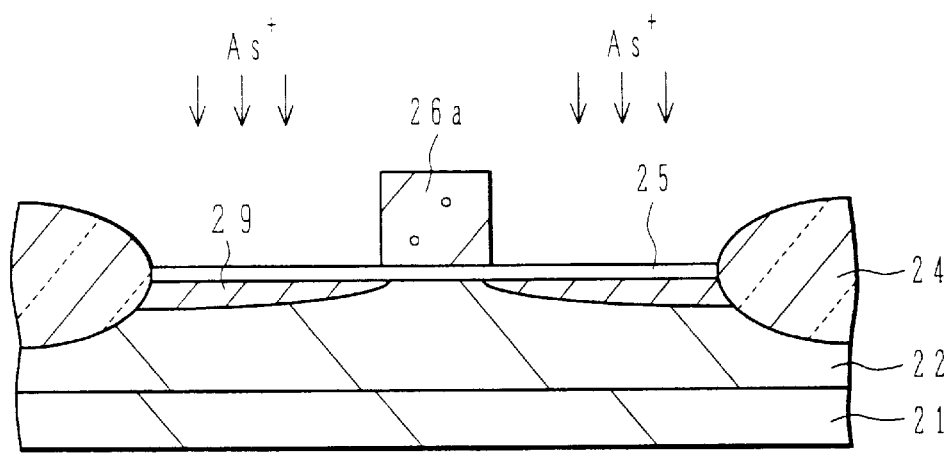

As shown in FIG. 6B, $As^+$ ions are implanted by using the gate electrode 26a as a mask to form a shallow n-type diffused layer 29 of the LDD (Lightly doped drain) structure.

Figure 6C:
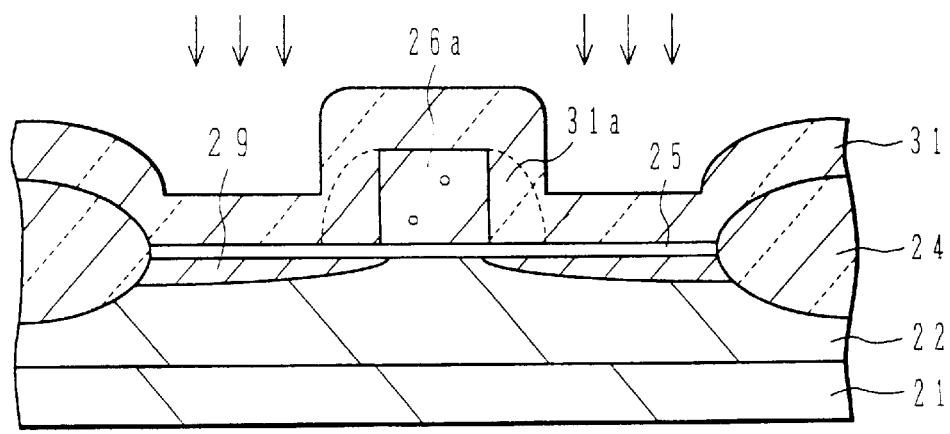

As shown in FIG. 6C, an insulating film 31 such as silicon oxide is formed by CVD over the whole surface of the silicon substrate. The insulating film 31 is etched by anisotropic dry etching (RIE) to leave side wall spacers (side wall insulating spacers) 31a only on the side walls of the gate electrode 26a.

Figure 6D:
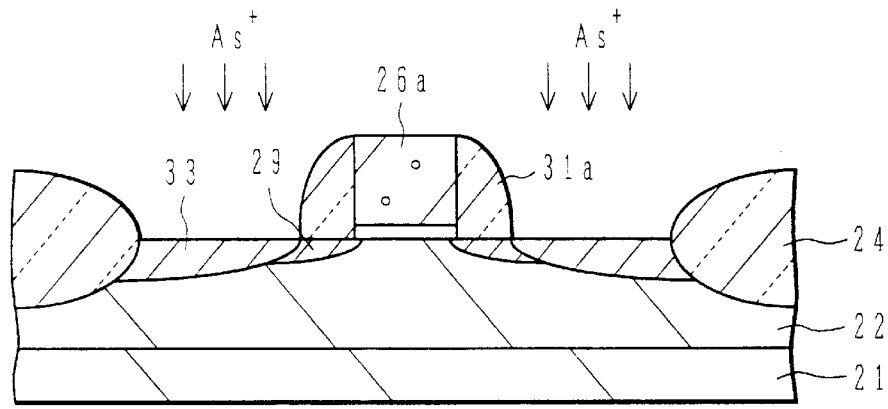

As shown in FIG. 6D, $As^+$ ions are implanted into the substrate formed with the side wall spacers 31a to form $n^+$-type source/drain regions 33 of high impurity concentration.

Figure 6E:
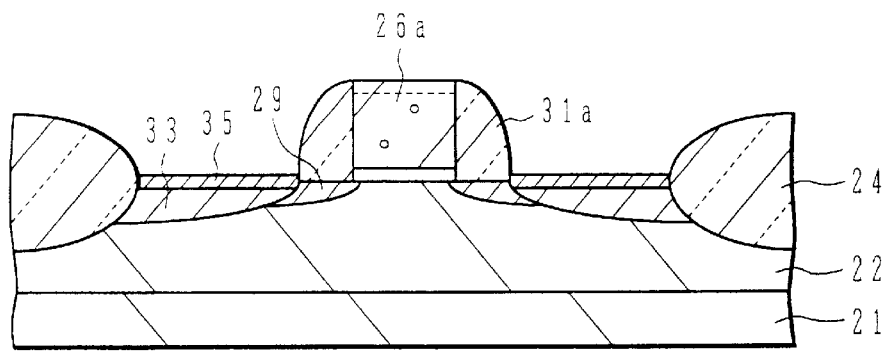

As shown in FIG. 6E, silicide electrodes 35 are formed on the high impurity concentration source/drain regions 33. The silicide electrodes are formed in the following manner. First, a thin oxide film on the surface of the silicon active region is removed by etchant, and a refractory metal film such as Co is deposited on the silicon active region by sputtering. Next, a two-step short time heat treatment is performed to form a refractory metal silicide film 35 in a self-alignment manner on the exposed silicon active region. If the gate electrode 26a is exposed, a silicide film is formed also on the gate electrode 26a. If an insulating film is formed on the gate electrode, a silicide film is not formed on the gate electrode 26a.

With the two-step short time heat treatment, first a primary suicide reaction (silicidation) is performed at a low temperature, and after an unreacted refractory metal film is washed out by etchant, a secondary heat treatment is executed to form a perfect silicide film 35.

Silicide may use one of the materials including cobalt silicide, titanium silicide, platinum silicide, molybdenum silicide, tungsten silicide, and nickel silicide, or a combination of these materials.

Figure 6F:
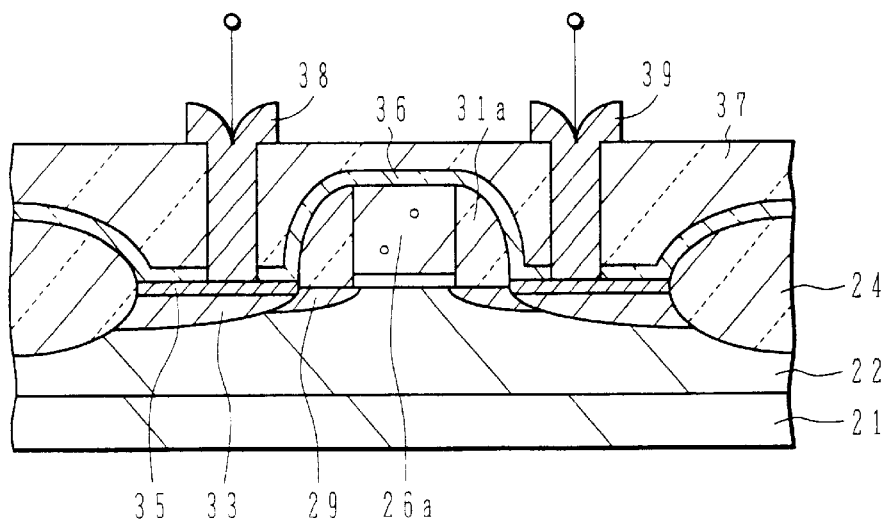

As shown in FIG. 6F, a silicon nitride film 36 is deposited over the whole surface of the substrate. This silicon nitride film 36 is a plasma CVD film formed by plasma CVD using source gasses of $SiH_4$ (at flow rate of 18 sccm) and $NH_3$ (at flow rate of 60 sccm) under the conditions of a pressure of 1.5 Torr, a substrate temperature of 350° C., and a RF power of 0.11 W/cm$^2$ to 0.85 W/cm$^2$ at 13.56 MHz.

Next, a silicon oxide film 37 is formed on the silicon nitride film 36 by plasma CVD. This plasma CVD is performed by setting an RF power to 0.1 W/cm$^2$ to 0.85 W/cm$^2$ at 13.56 MHz. The source gasses may be $SiH_4$ and $N_2O$.

In the above manner, the interlayer insulating film made of a lamination of the silicon nitride film 36 and silicon oxide film 37 is formed by plasma CVD with a limited RF power. In place of the silicon nitride film 36, a silicon oxynitride film may be used. Si source gas may be $SiH_4$, $Si_2H_6$, $SiH_2Cl_2$, or $SiHCl_3$.

Si source gas for the silicon oxide film 37 may use $SiH_4$, $Si_2H_6$, tetraethoxyorthosilane (TEOS), tetraethylfluorosilane (TEFS), or the like. A silicon oxide film or the like may be formed before the silicon nitride film 36 is formed.

After plasma CVD, rapid thermal annealing (RTA) is performed in an atmosphere such as $N_2$ for 30 seconds at 800° C. This heat treatment degasses hydrogen permeating through the silicon nitride film 36 and silicon oxide film 37, and improves the film quality. Instead of an $N_2$ atmosphere, ozone, argon, or oxygen may be used. Instead of RTA, heating with a resistance heating furnace may be used.

Thereafter, contact holes are formed through the interlayer insulating film made of the silicon nitride film 36 and silicon oxide film 37 to expose the surfaces of the silicide film 35 on the source/drain regions. Metal wiring patterns 38 and 39 including a barrier metal layer and an Al alloy layer are formed to pull the electrodes of MOSFET to the upper layer.

Similar processes of the manufacture method of n-channel MOSFETs described above can be used for the manufacture of p-channel MOSFETs.

A manufacture method of p-channel MOSFETs will be described with reference to FIGS. 7A to 7F.

Figure 7A:
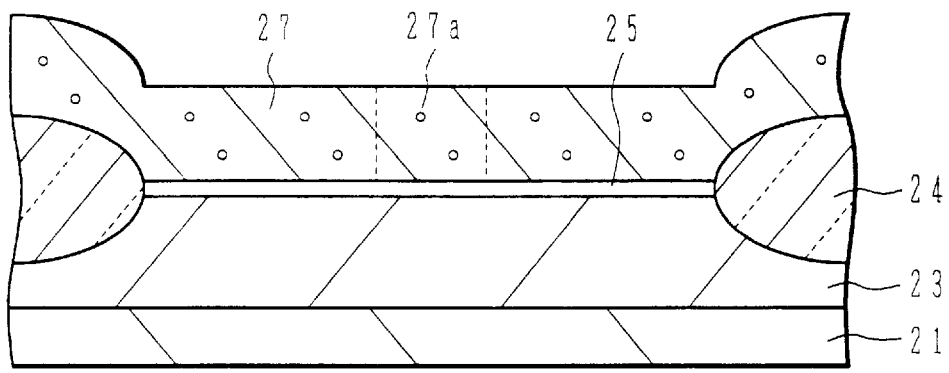
FIGS. 7A to 7F are cross sectional views illustrating main processes of a manufacture method of semiconductor devices with p-channel MOSFETs according to an embodiment of the invention.

As shown in FIG. 7A, after an n-type well 23 is formed in the surface area of a CZ silicon substrate 21 having the (100) plane, an element isolation region 24 of silicon oxide is formed by well know LOCOS. A gate oxide film 25 of about 6 nm thick is formed on the surface of the active region defined by the element isolation region. A polysilicon film 27 is deposited to a thickness of 200 nm by well known LPCVD, covering the gate oxide film 25.

Figure 7B:
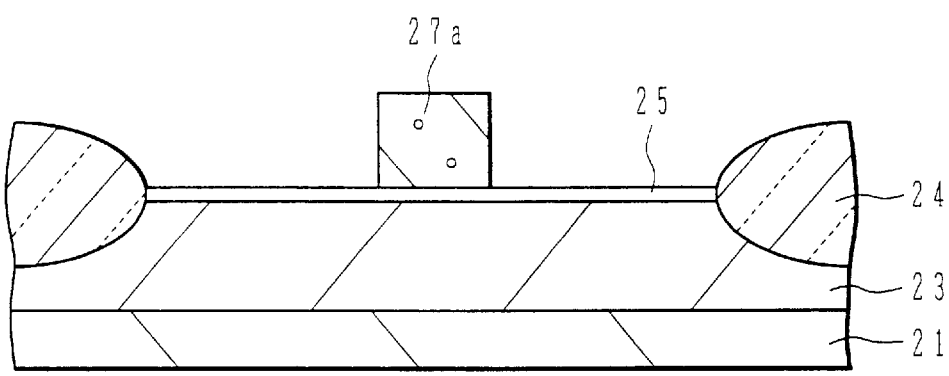

As shown in FIG. 7B, the polysilicon film 27 is selectively etched by using photolithography to form a gate electrode 27a.

Figure 7C:
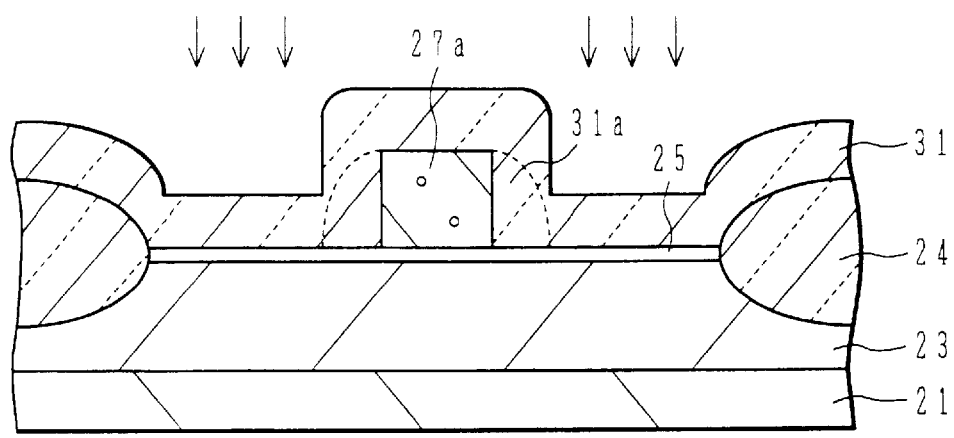

As shown in FIG. 7C, an insulating film 31 such as silicon oxide is formed by CVD over the whole surface of the substrate. Anisotropic etching is performed to leave side wall spacers 31a on the side walls of the gate electrode 27a.

Figure 7D:
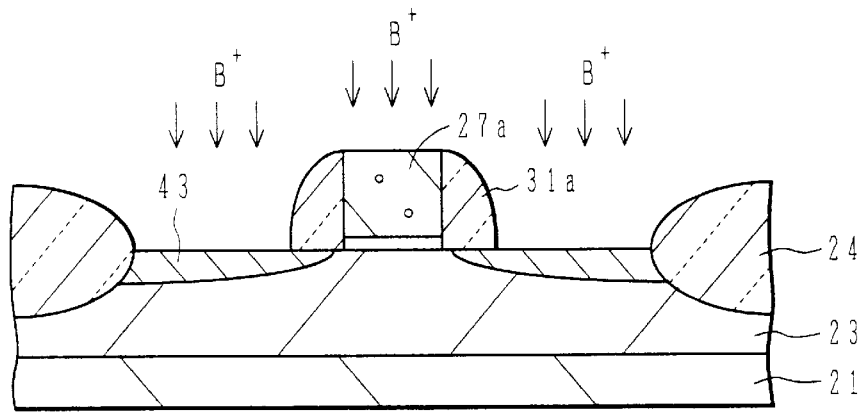

As shown in FIG. 7D, by using the gate electrode 27a and side wall spacers 31a as a mask, $B^+$ ions are implanted as p-type impurities to form p-type source/drain regions 43.

An oxide film formed on the exposed surface of the silicon active region is removed by etchant to expose a clean silicon surface.

Figure 7E:
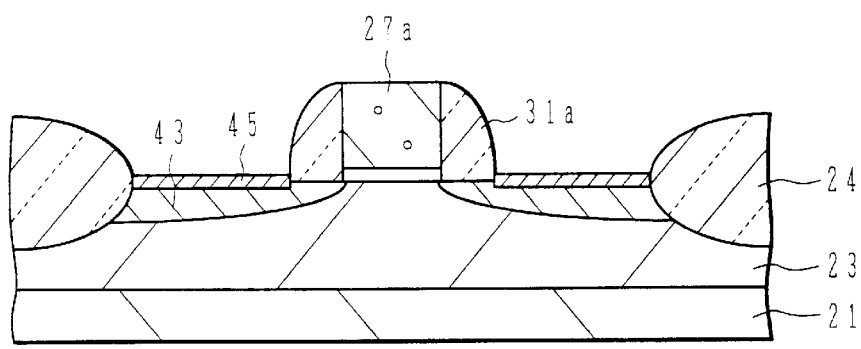

As shown in FIG. 7E, a silicide film 45 such as cobalt suicide Ls formed on the exposed silicon surface. The sumicide film 45 can be formed by the two-step short time heat treatment similar to the previous embodiment.

Figure 7F:
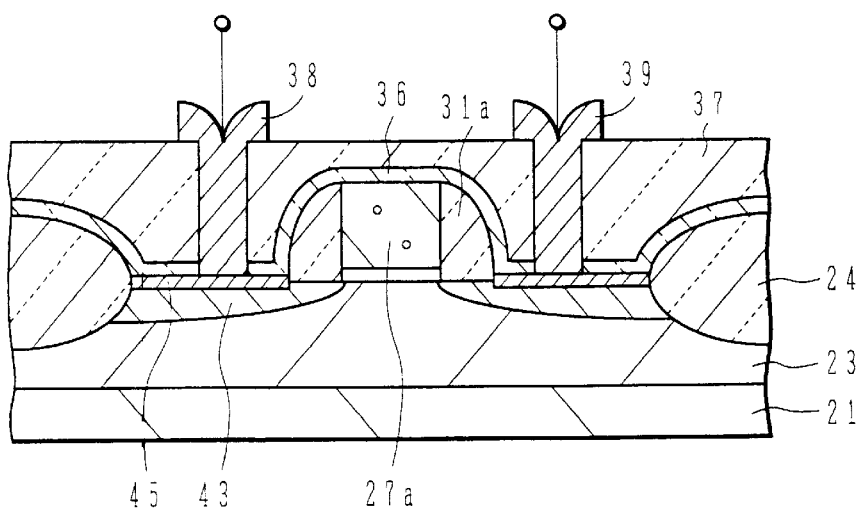

As shown in FIG. 7F, a silicon nitride film 36 and a silicon oxide film 37 are deposited over the whole surface of the substrate by plasma CVD. The silicon nitride film 36 may be formed under the conditions of an atmosphere pressure of 1.5 Torr, a substrate temperature of 350° C., and an RF power of 0.11 W/cm$^2$ to 0.85 W/cm$^2$, by using source gasses of $SiH_4$ (18 sccm) and $NH_3$ (60 sccm).

Annealing is preferably performed after th e plasma CVD, similar to the previous embodiment. For example, RTA is performed for 30 seconds at 800° C. in an $N_2$ atmosphere.

Thereafter, contact holes are formed through the silicon nitride film 36 and silicon oxide film 37, and a metal wiring layer including a barrier metal layer and an Al alloy layer is deposited and patterned to form electrodes 38 and 39. In the above manner, p-channel MOSFETs are completed.

N-channel MOSFETs shown in FIGS. 6A to 6F and p-channel MOSFETs shown in FIGS. 7A to 7F can be formed on the same substrate. Corresponding elements in FIGS. 6A to 6F and in FIGS. 7A to 7F are represented by identical reference numerals, and they can be formed by identical processes.

In the plasma CVD process at FIGS. 6F and 7F, the substrate temperature can be selected from a range of 150° C. to 550° C. The RF frequency is not limited to 13.56 MHz. The atmosphere pressure can be selected from a range of 1.5 Torr to 10 Torr. An atmosphere of annealing after the plasma CVD may use argon, $N_2$, ozone containing $O_2$, or $O_2$. Preferably, an atmosphere easier to outward diffuse hydrogen is used.

Instead of heat treatment, a plasma process may be used for degassing hydrogen after the plasma CVD. In this case, the plasma process temperature can be selected from a range of 300° C. to 550° C. A plasma process atmosphere may use $O_2$, $N_2$, Ar, or $N_2O$.

If a silicon nitride film is used as the etching stopper, the refractive index of the silicon nitride film is preferably selected from a range of 1.9 to 2.9. The higher the refractive index of the nitride film, generally the higher the etching selection ratio to the oxide film. Therefore, from the viewpoint of an etching stopper function, the refractive index is preferably set higher. If $SiH_4$ and $NH_3$ are used as source gasses of the silicon nitride film, the refractive index can be made high by setting a flow rate of $SiH_4$ higher than $NH_3$. In this embodiment, the refractive index measured through ellipsometry at a wavelength of 632.8 nm is used.

Figure 13A:
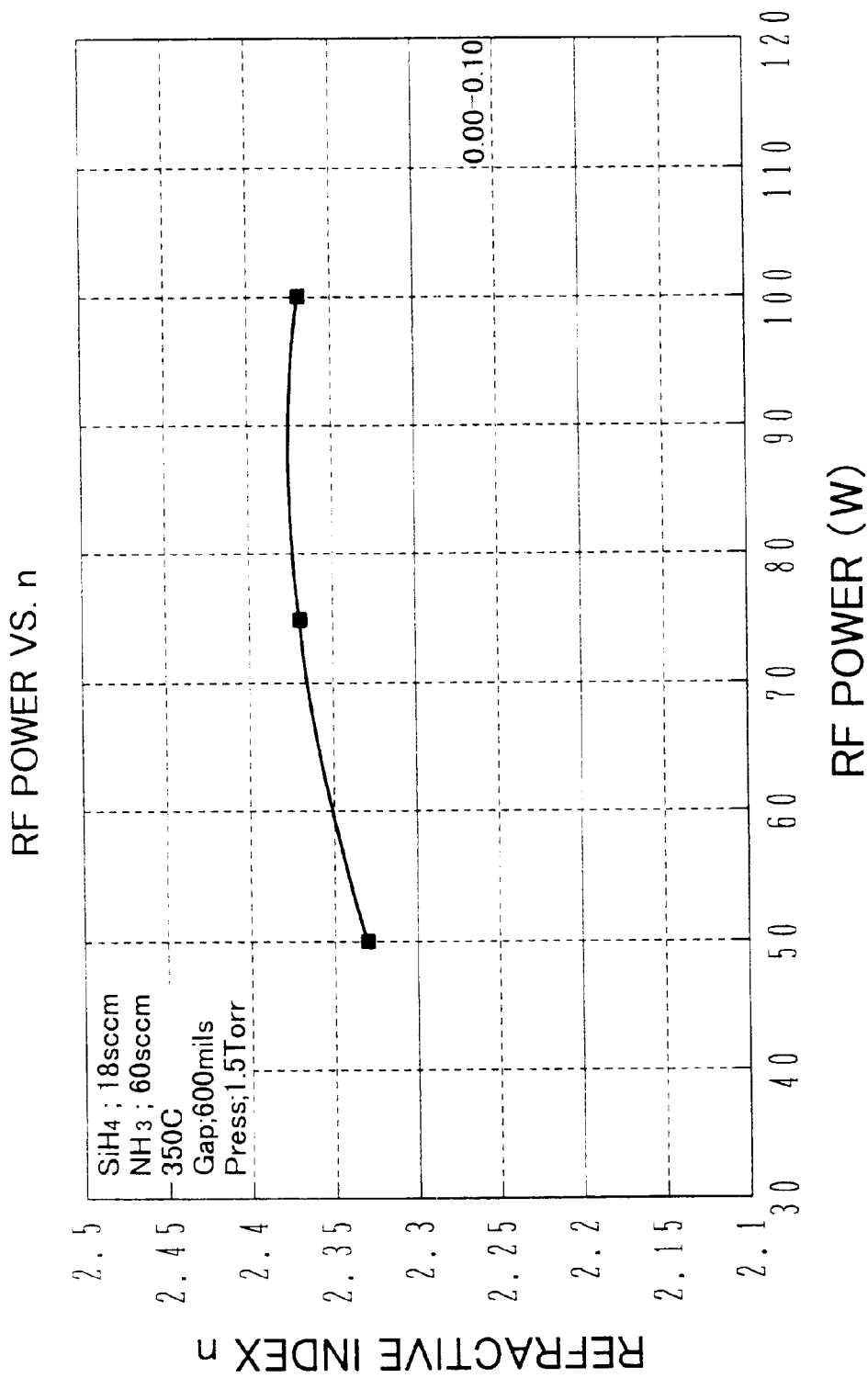
FIGS. 13A and 13B show variation of the real part (refractive index) and the imaginary part (extinction coefficient) of the complex refractive index of silicon nitride films as a function of RF power.
Figure 13B:
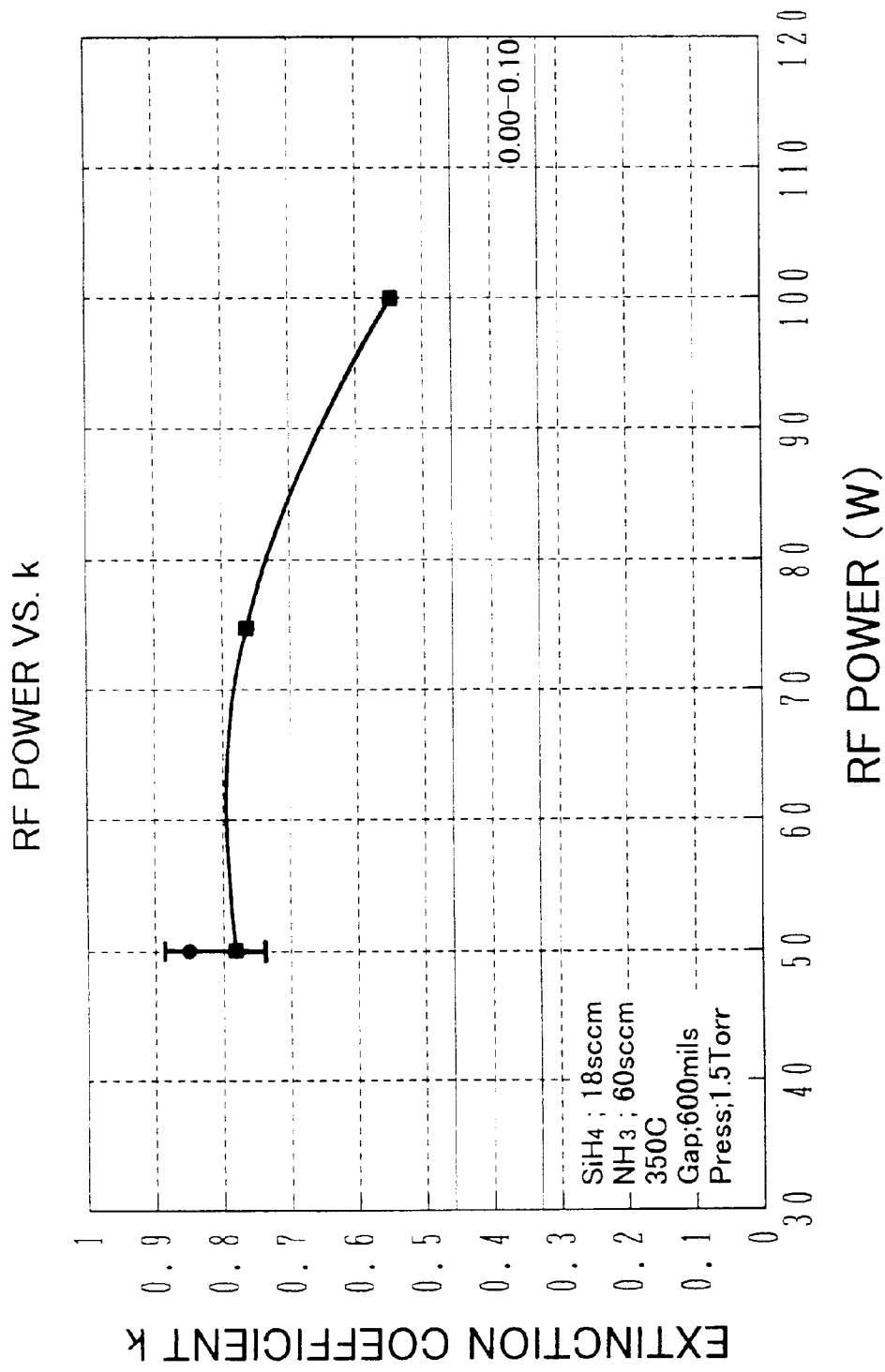

FIGS. 13A and 13B show variation of the real part (refractive index) and the imaginary part (extinction coefficient) of the complex refractive index of silicon nitride films as a function of RF power. The silicon nitride films were formed by parallel plate electrodes (gap 600 mils) PECVD using $SiH_4$ (18 sccm) and $NH_3$ (60 sccm) as source gases, at a substrate temperature of 350° C., at a pressure of 1.5 Torr.

The real part n of the complex refractive index is above 2.3 and has a tendency of becoming small as the RF power decreases.

The imaginary part k of the complex refractive index is generally above 0.5 and has a tendency of becoming large as the RF power decreases.

Figure 14A:
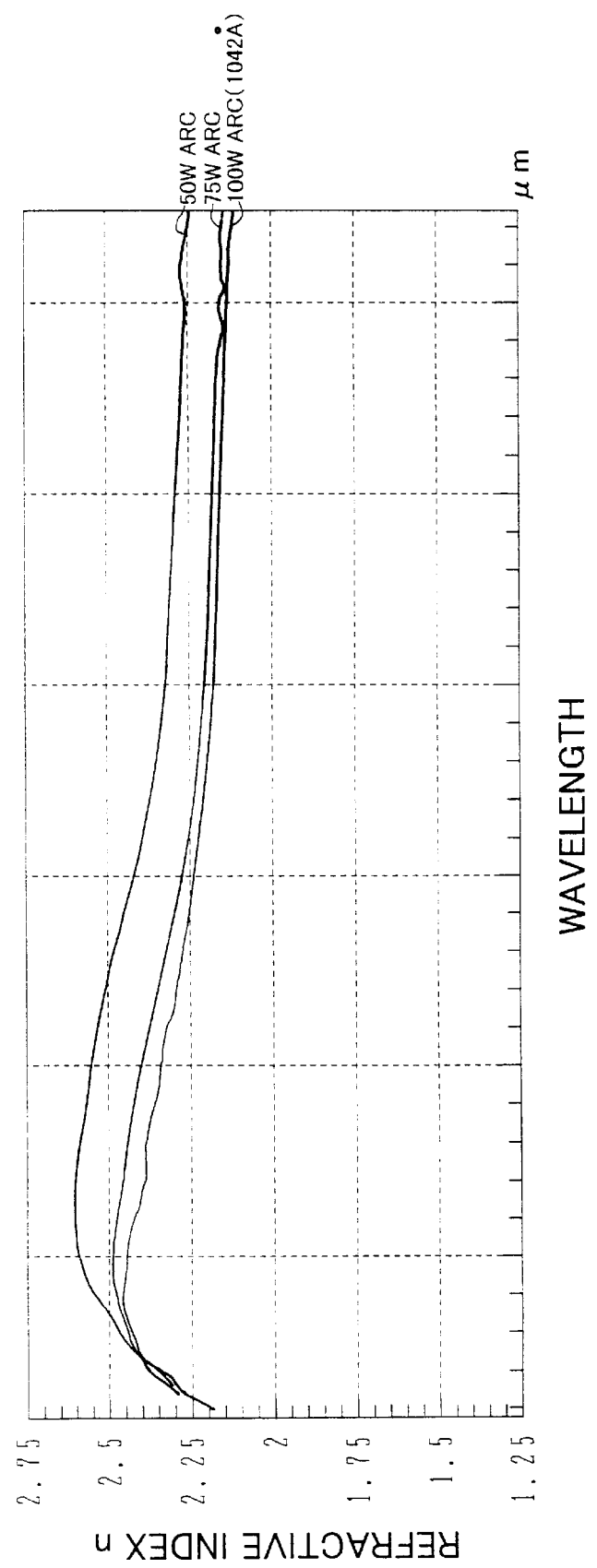
FIGS. 14A and 14B show spectral distribution of the complex refractive index of silicon nitride films prepared similar to the samples of FIGS. 13A and 13B.
Figure 14B:
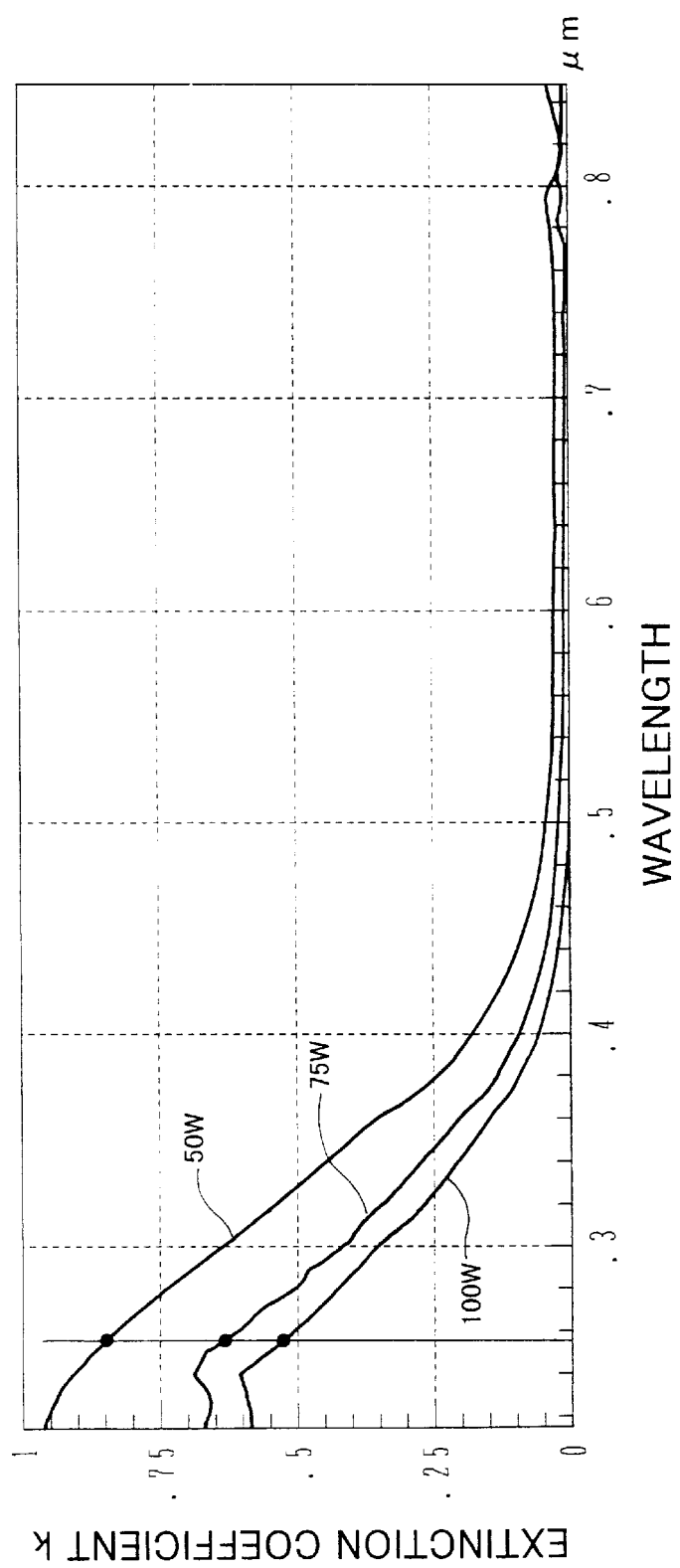

FIGS. 14A and 14B show spectral distribution of the complex refractive index of silicon nitride films prepared similar to the samples of FIGS. 13A and 13B. It is noted that the extinction coefficient at short wavelengths becomes high as the RF power decreases.

The above results show that the silicon nitride films formed at lower RF power have enhanced antireflection function.

The standing wave is generated in a resist layer when there exist waves propagating in opposite directions, i.e. the incident light and the reflected light in the resist layer. When the thickness of the resist layer and/or the underlying transparent or semi-transparent layer varies, the interference of the lights increases or decreases. When the standing wave is intense, i.e. when the amplitude of the light intensity component which varies periodically by multiple interference is large, the sensitivity of the resist varies largely by the variation in the thickness of the resist layer and the underlying layer.

It is preferred that the standing wave in the resist layer should be suppressed as large as possible. For suppressing the standing wave, it is preferable to increase the real part (refractive index) and the imaginary part (extinction coefficient) of the complex refractive index to a certain degree. If the extinction coefficient of the underlying layer is made higher, the standing wave in the resist layer will be suppressed.

As stated above, the silicon nitride film formed by low RF power plasma has an increased extinction coefficient which can function to suppress the standing wave, relative to high RF power plasma deposition. From another point of view, the increased extinction coefficient may be ascribed to excess silicon composition in the silicon nitride.

In the above embodiments, the amount of permeating hydrogen is controlled by limiting an RF power and heat treatment temperature of PECVD. If a silicon nitride film is used as the interlayer insulating film, the silicon nitride film may be formed by single wafer processing type CVD.

As thermal CVD, a batch CVD system and a single wafer type CVD system are known. The batch CVD system requires a higher heating temperature (e.g., about 750° C.) and a longer process time (e.g., 2 to 3 hours). It is said that these conditions diffuse doped ions (particularly B ions) in the gate electrode and form defects in or at the interface of the gate oxide film. This phenomenon is conspicuous particularly in p-channel MOSEFTs with B doped gate electrodes. If impurities doped in the gate electrode penetrate through the gate oxide film and diffuse into the channel region, the threshold voltage of MOSFET becomes unstable. If defects are formed in or at the interface of the gate oxide film, the speed of shortening a lifetime in terms of BT stress is increased. The batch CVD system does not also meet the need of low temperature processes.

With the single wafer processing type thermal CVD system, a silicon nitride film can be formed at a heating temperature of 550° C. to 600° C. and a process time of about 10 minutes. These conditions are satisfactory for the need of low temperature processes. The process time can be shortened further if the substrate temperature is raised during single wafer processing type thermal CVD. Therefore, the substrate temperature for the single wafer processing type thermal CVD can be selected from a range of 500° C. to 800° C.

FIG. 12 shows calculation results of boron (B) diffusion. Boron concentration distributions in the depth direction were calculated respectively for diffusion temperatures of 750° C., 700° C., 550° C., and 400° C. and diffusion times of 360 min., 30 min., and 10 min. In FIG. 12, of these distributions, only typical ones are shown.

The degree of diffusion is as small as it does not pose any practical problem if the diffusion time is 10 minutes even if the diffusion temperature is 750° C. or 700° C. However, at the diffusion time of 30 minutes, diffusion becomes radical and is perhaps unable to use it practically. If the diffusion temperature is 550° C. or lower, it can be expected that there is no problem at all even if the diffusion time is 360 minutes. If a depth of 0.02 $\mu$m or more at which the concentration becomes one tenth the surface concentration, is used as an allowable diffusion limit, the diffusion time is 25 minutes or shorter at the diffusion temperature of 800° C. In this case, therefore, the substrate temperature during thermal CVD can be selected from a range of 500° C. to 800° C.

The batch CVD system requires, for example, a substrate temperature of 750° C. and a process time of 2 to 3 hours. It may be difficult, however, to lower the substrate temperature or shorten the process time to the degree that boron diffusion becomes negligible.

Figure 8A:
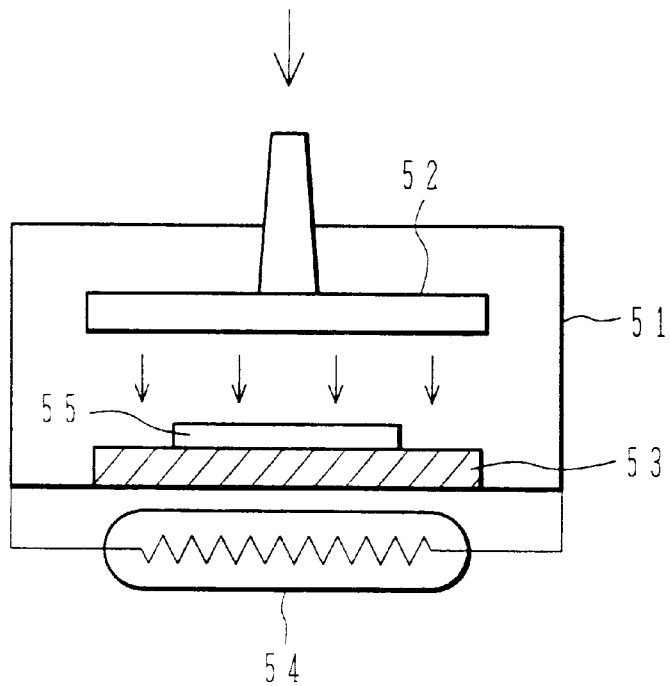
FIGS. 8A and 8B are cross sectional views schematically showing the structure of single wafer processing type thermal CVD systems.
Figure 8B:
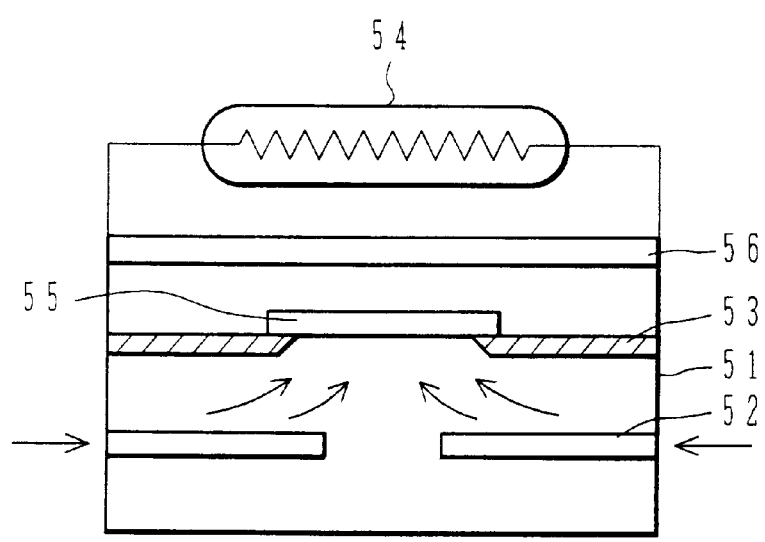

FIGS. 8A and 8B show examples of a single wafer processing type thermal CVD system.

Referring to FIG. 8A, a gas supply unit 52 is disposed at the upper portion of a chamber 51, and at the downstream a susceptor 53 is disposed. The suseeptor 53 can be heated with a lamp 54 from the lower side. A wafer 55 is placed on the susceptor 53.

Referring to FIG. 8I3, a susceptor 53 is disposed at the middle portion of a chamber 51 and has an opening at the central area. A gas supply unit 52 is disposed below the susceptor 53. A thermal CVD film is deposited on the lower surface of a wafer 55 placed upside down on the susceptor 53. A quartz window 56 is disposed at the upper wall of the chamber 51, and a heating lamp 54 is disposed above the quartz window 56.

A manufacture method of CMOSFETs according to an embodiment of the invention will be described with reference to FIGS. 9A to 9M.

Figure 9A:
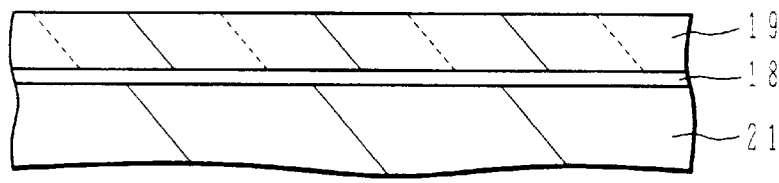
FIGS. 9A to 9M are cross sectional views illustrating main processes of a manufacture method of semiconductor devices with CMOSFETs according to an embodiment of the invention.

As shown in FIG. 9A, a silicon oxide pad film 18 and a silicon nitride mask film 19 are formed on the surface of a p-type Si substrate 21.

Figure 9B:
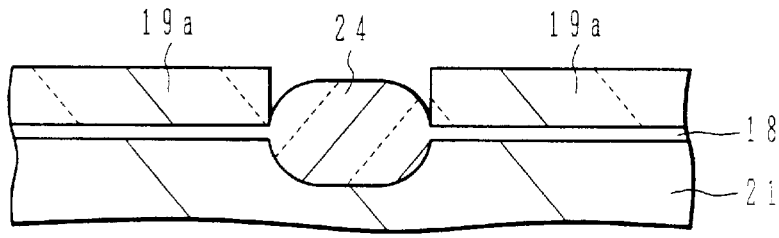

As shown in FIG. 9B, the silicon nitride film 19 is patterned by using photolithography to form a silicon nitride film 19a with an opening. By using this silicon nitride film 19a as a mask, an element separation (field oxide) region 24 is formed by well known LOCOS.

Figure 9C:
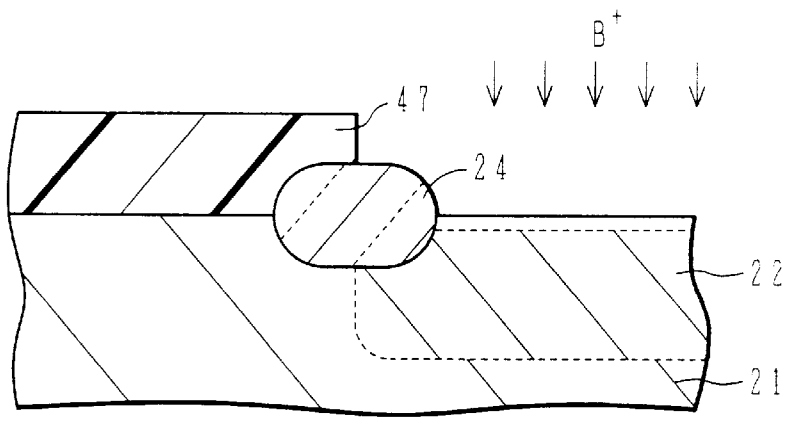
Figure 9D:
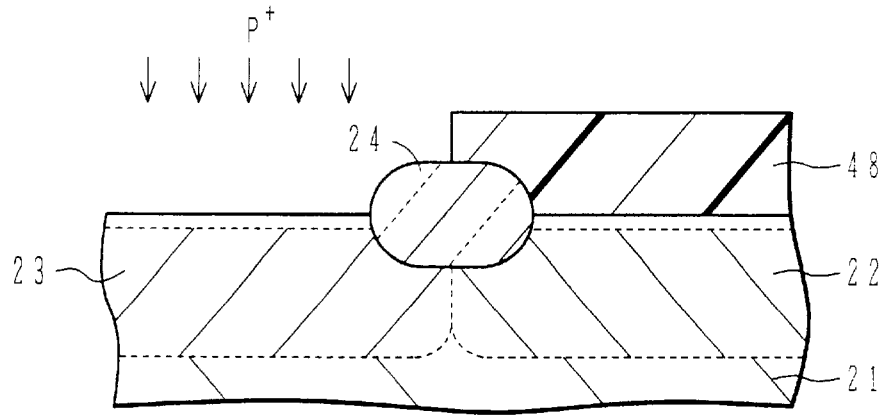

As shown in FIG. 9C, a resist mask 47 is formed on the surface of the substrate, and $B^+$ ions, for example, are implanted to form a p-type well 22. Thereafter, the resist mask is removed.

As shown in FIG. 9A, a resist mask 48 covering the p-type well 22 is formed, and $P^+$ ions, for example, are implanted to form an n-type well 23. Thereafter, the resist mask is removed. The order of forming a field oxide region and p- and n-type wells can be changed.

Figure 9E:
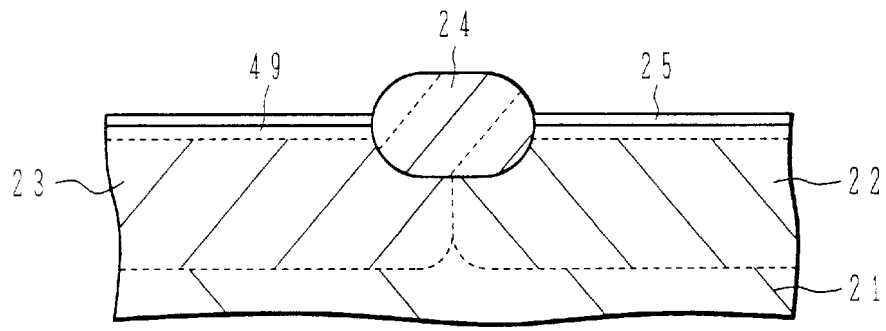

As shown in FIG. 9E, a gate oxide film 25 of about 5.5 nm thick is formed on the surface of the silicon substrate active region, and ions are implanted to form a doped channel region 49.

Figure 9F:
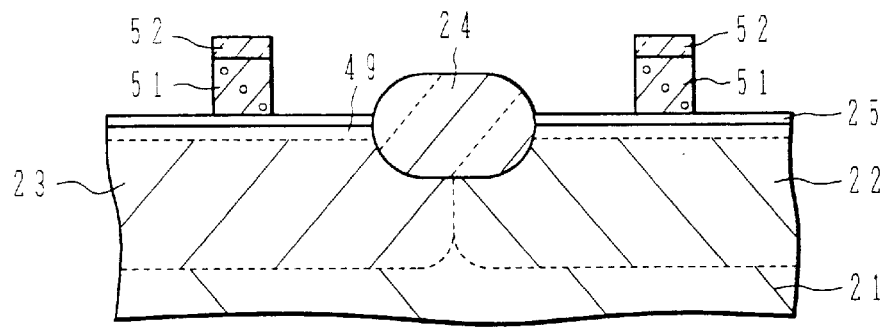

As shown in FIG. 9F, a lamination of a polysilicon film 51 and a silicon oxide film 52 is formed and patterned to form a gate electrode 51 and a silicon oxide film 52 on the electrode 51.

Figure 9G:
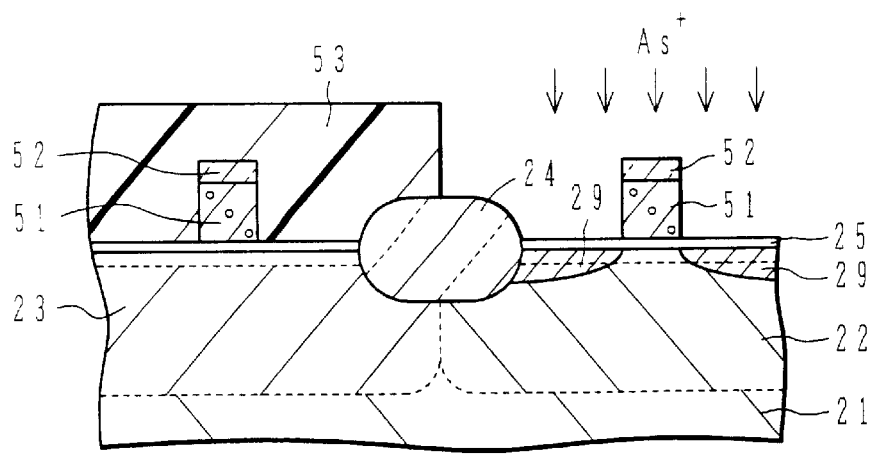

As shown in FIG. 9G, a resist mask 53 is formed over the n-type well 23, and $As^+$ ions are implanted to form source/drain regions 29 of the LDD structure on both sides of the gate electrode 51. Thereafter, the resist mask is removed.

Figure 9H:
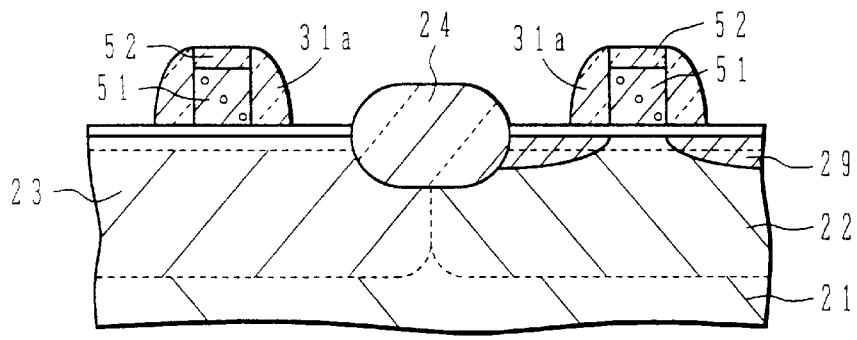

As shown in FIG. 9H, a silicon oxide film is deposited over the whole surface of the substrate, and anisotropic etching such as reactive ion etching is performed to form side wall spacers 31a on the side walls of the gate electrode.

Figure 9I:
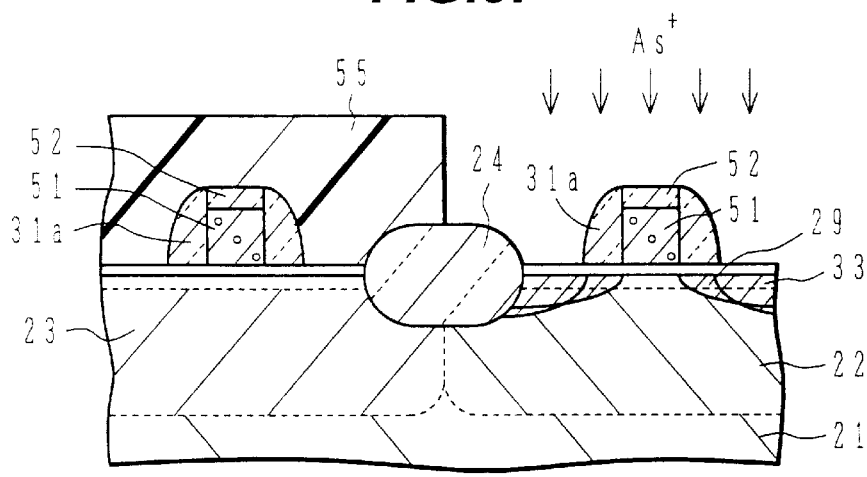

As shown in FIG. 9I, a resist mask 55 is formed over the n-type well 23, and $As^+$ ions are implanted to form high impurity concentration source/drain regions 33. Thereafter, the resist mask is removed.

Figure 9J:
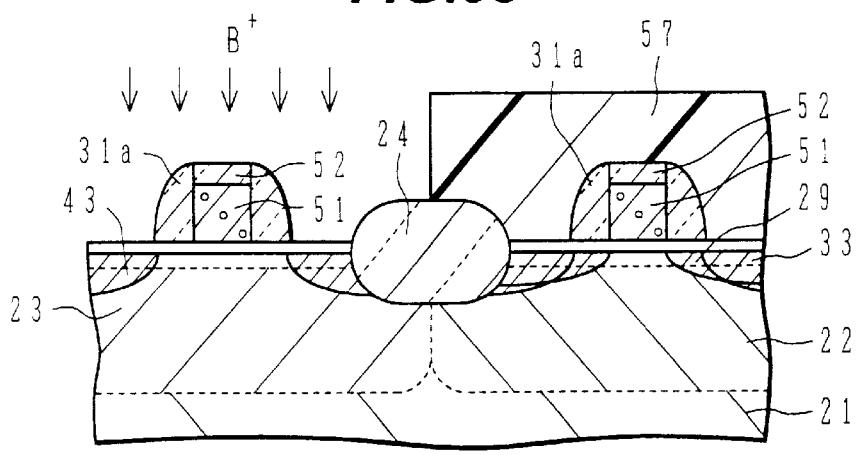

As shown in FIG. 9J, a resist mask 57 is formed over the p-type well 22, and $B^+$ ions are implanted to form source/drain regions 43 of a p-channel MOSFET. Thereafter, the resist mask is removed.

Figure 9K:
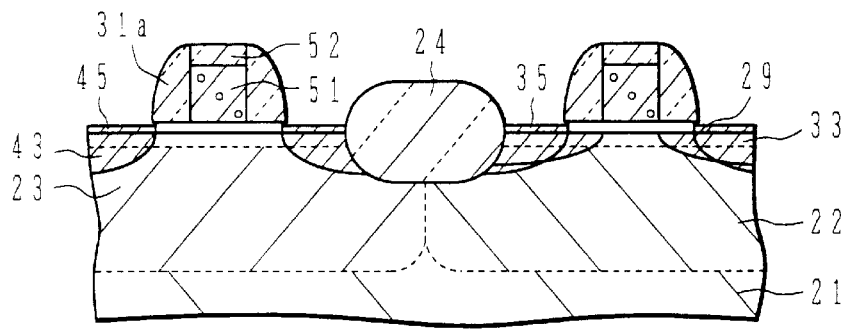

As shown in FIG. 9K, after doped impurity ions are activated by RTA, Co suicide films 45 and 35 are formed on the exposed silicon surface. The silicide film can be formed by depositing a Co film and performing the two-step short time thermal process in the manner similar to the previous embodiment.

Figure 9L:
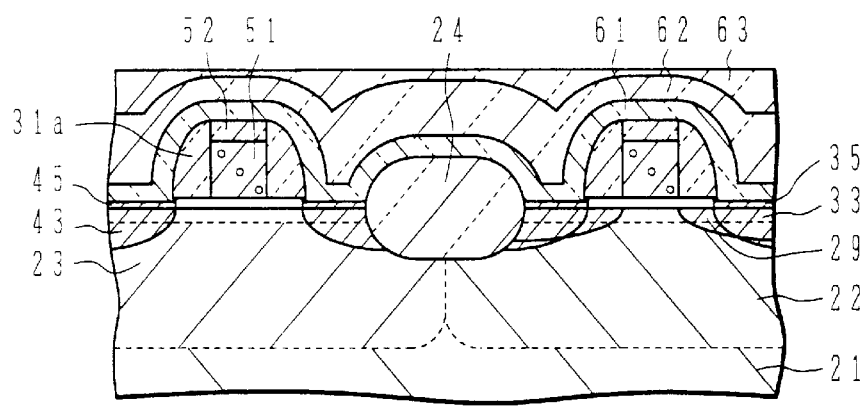

As shown in FIG. 9L, a silicon nitride film 61, a silicon oxide film 62, and an SOG film 63 are formed on the substrate surface with the silicide films.

The silicon nitride film 61 is deposited to a thickness of about 70 nm by using a single wafer processing type thermal CVD system, for example, under the conditions of an atmosphere pressure of 60 Torr and a substrate temperature of 600° C. by using $SiH_4$ (45 sccm) and $NH_3$ (1000 sccm). Instead of the silicon nitride film 61, a silicon oxynitride film may be used. Si source gas may be $SiH_4$, $Si_2H_6$, $SiH_2$, $Cl_2$, or $SiHCl_3$. A silicon oxide film or the like may be formed before the silicon nitride film 61 is formed.

The silicon oxide film 62 is deposited to a thickness of about 150 nm by PECVD, similar to the previous embodiment. As Si source gas, tetraethoxyorthosilane (TEOS) may be used. Si source gas for the silicon oxide film 62 may use $SiH_4$, $Si_2H_6$, TEOS, tetraethylfluorosilane (TEFS), or the like. A silicon oxide film or the like may be formed before the silicon nitride film 61 is formed. The silicon oxide film 62 may be formed by using a single wafer processing type thermal CVD system.

The SOG film 63 has a surface planarizing function. For example, the SOG film 63 is applied to a thickness of about 200 nm at the flat portion of the underlying layer. Planarization may be performed by chemical mechanical polishing (CMP).

Figure 9M:
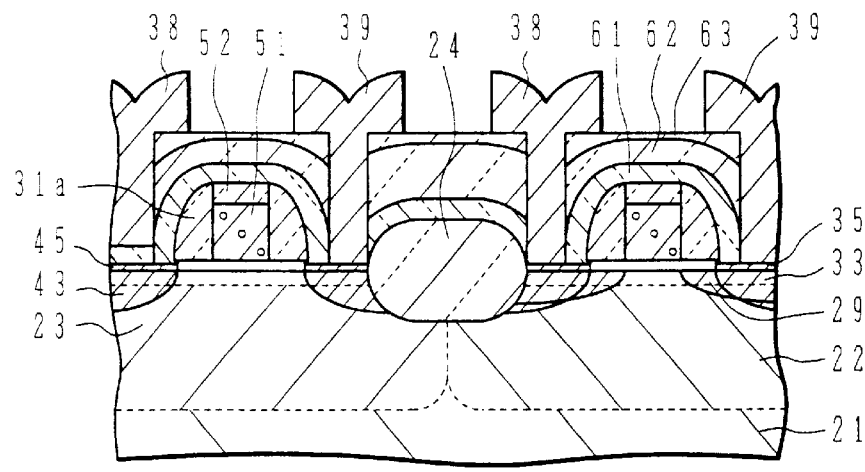

As shown in FIG. 9M, contact holes are formed through the interlayer insulating film, and a wiring layer is formed and patterned to form electrodes 38 and 39. In the above manner, CMOSFETs can be manufactured.

Figure 10A:
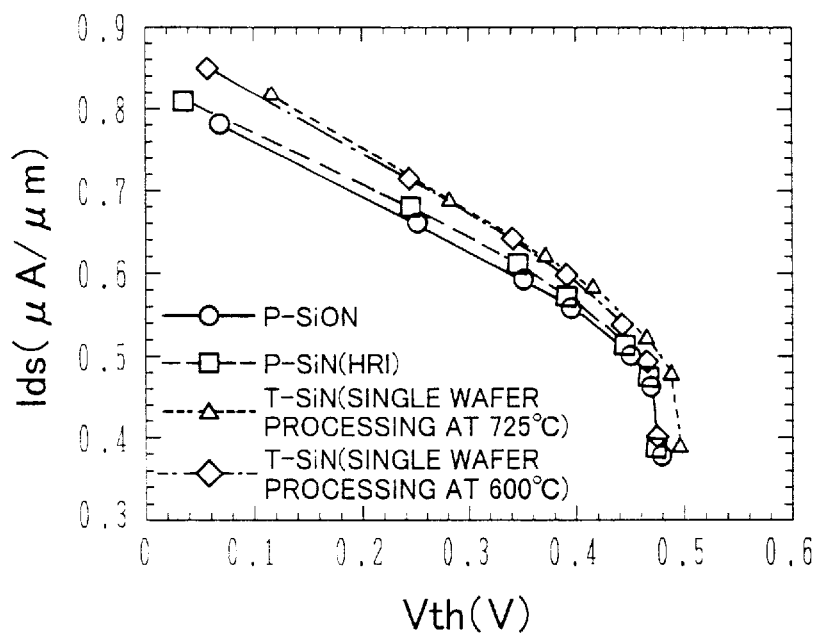
FIGS. 10A and 10B are graphs showing measurement results of samples formed by the embodiment method of the invention.
Figure 10B:
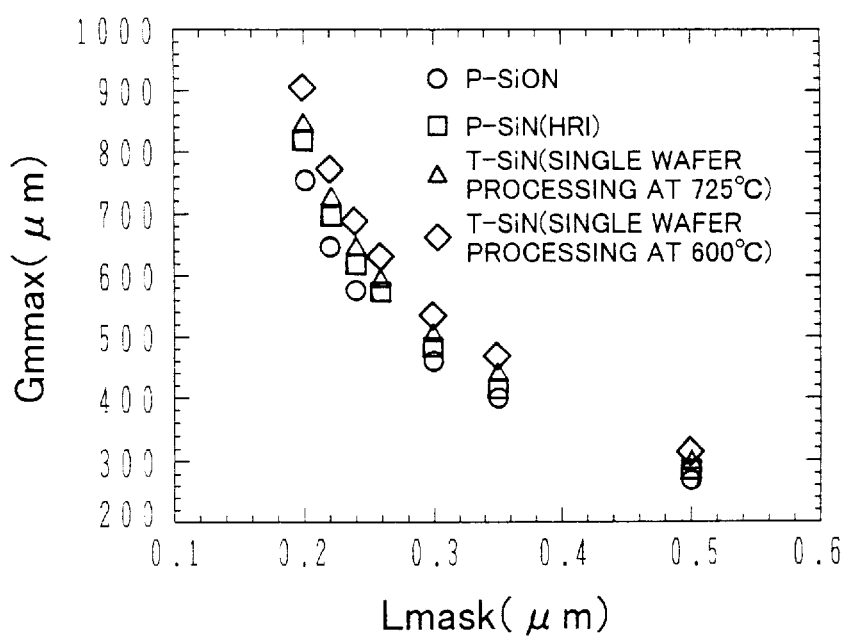

FIGS. 10A and 10B show electrical characteristics of n-channel MOSFETs manufactured by the embodiment method as compared to electrical characteristics of n-channel MOSFETs manufactured by another method.

FIG. 10A is a graph showing a change in the saturated drain/source current Ids relative to the threshold voltage Vth. For comparison, n-channel MOSFETs using SiON or silicon nitride films formed by PECVD as the interlayer insulating film (lower layer) were measured. A circle symbol indicates a plot for SiON films by PECVD, and a square symbol indicates a plot for silicon nitride films by PECVD. A triangle symbol and a diamond symbol indicate plot for silicon nitride films formed by single wafer processing type thermal CVD at 725° C. and 600° C. It is to be noted that samples by single wafer processing thermal CVD have saturated current higher by about 5 to 10% than other samples.

FIG. 10B is a graph showing a change in the maximum mutual conductance of n-channel MOSFET as a function of the mask width Lmask.

Also in this case, samples with silicon nitride films formed by single wafer processing type thermal CVD have the maximum mutual conductance Gmax larger by about 3% than other samples.

Figure 11:
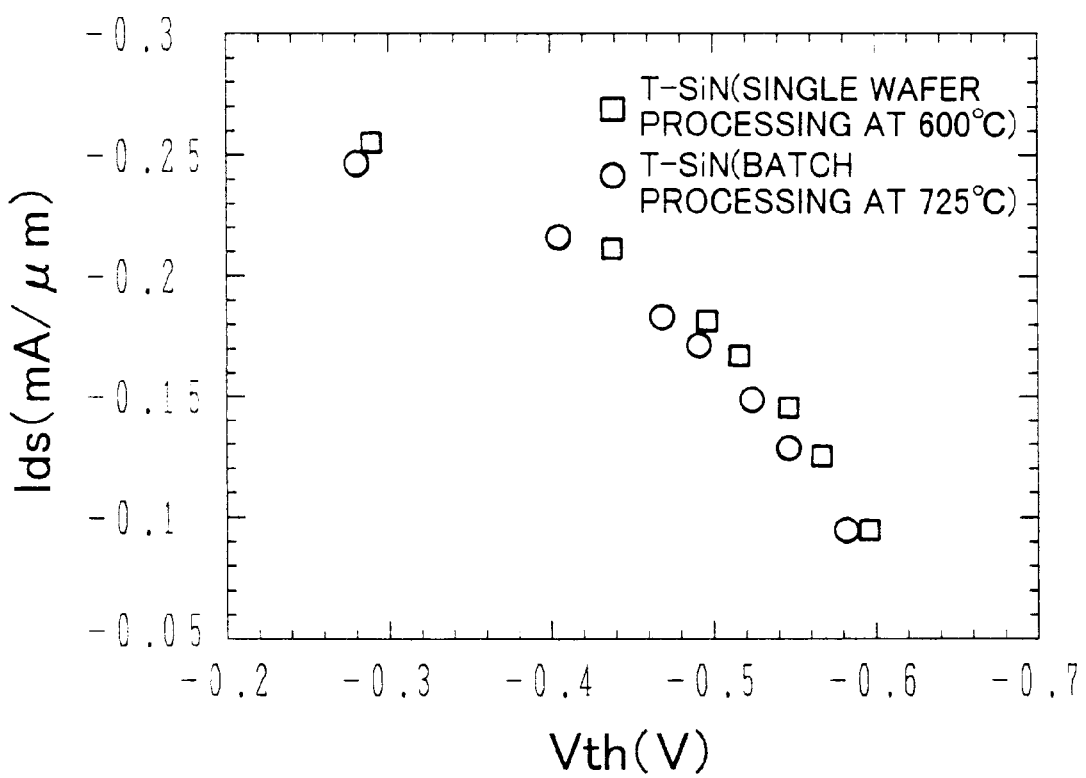
FIG. 11 is a graph showing measurement results of samples formed by the embodiment method of the invention.

FIG. 11 is a graph showing the saturated drain current Ids of p-channel. MOSFETs as a function of the threshold voltage Vth. A circle symbol indicates a plot for p-channel MOSFET with a silicon nitride film formed by a batch thermal CVD system at 725° C., and a square symbol indicates a plot for p-channel MOSFET with a silicon nitride film formed by a single wafer processing type thermal CVD at 600° C. With the batch thermal CVD, the saturated drain current of p-channel MOSFET tends to lower. With the single wafer processing type thermal CVD, however, the saturated drain current can be maintained higher than with the batch thermal CVD.

The present invention has been described in connection with the preferred embodiments. The invention is not limited only to the above embodiments. It is apparent that various modifications, improvements, combinations, and the like can be made by those skilled in the art.

We claim:

1. A method of manufacturing a semiconductor device comprising the steps of:

(a) forming a MOS transistor structure on a semiconductor substrate, said MOS transistor structure having an insulated gate electrode;

(b) depositing an insulating film covering said insulated gate electrode over said semiconductor substrate, by diode parallel plate electrode plasma CVD using hydrogen-containing source gas under the conditions of a normalized RF power of 0.11 W/cm$^2$ to 0.85 W/cm$^2$ at the parallel plate electrode; and (c) after said step (b), degassing hydrogen from said insulating film.

2. A method according to claim 1, wherein said RF power has a frequency of 13.56 MHz.

3. A method according to claim 1, wherein said step (a) forms a plurality of MOS transistor structures and includes a subsidiary step of doping n-type impurities into ones of said insulated gate electrodes of the MOS transistor structures and a subsidiary step of doping p-type impurities into the others of said insulated gate electrodes.

4. A method according to claim 3, wherein said step (a) includes a subsidiary step of forming insulating side wall spacers on side walls of each of said insulated gate electrodes of the MOS transistor structures and a subsidiary step of forming self-aligned silicide layers on source/drain regions on both sides of each of said insulated gate electrodes.

5. A method according to claim 1, wherein said step (b) deposits a first insulating film made of SiN or SiON on said semiconductor substrate, said method further comprising the step of depositing a second insulting film on said first insulating film.

6. A method according to claim 1, wherein said step (b) deposits an SiN film having a refractive index of 1.9 to 2.9 as measured through ellipsometry.

7. A method according to claim 1, wherein said step (c) includes a subsidiary step of thermally processing said semiconductor substrate at a predetermined temperature by rapid thermal annealling (RTA) or in a resistance heating furnace.

8. A method according to claim 7, wherein said predetermined temperature is in a range of 500° C. to 850° C.

9. A method according to claim 7, wherein said thermal processing subsidiary step is performed in an atmosphere of ozone, nitrogen, argon, or oxygen.

10. A method according to claim 1, wherein said step (c) includes a subsidiary step of processing said semiconductor substrate in plasma.

11. A method according to claim 10, wherein said plasma processing subsidiary step is performed while said semiconductor substrate is maintained at 300° C. to 550° C.

12. A method according to claim 10, wherein said plasma processing subsidiary step is performed in an atmosphere of oxygen, nitrogen, dinitrogen monoxide, or argon.

13. A method of manufacturing a semiconductor device, comprising the steps of:

forming an insulated gate electrode on a semiconductor substrate through a gate insulating film, the gate electrode including p-type impurity;

depositing silicon nitride or silicon oxynitride film on said semiconductor substrate, covering said insulated gate electrode using parallel plate plasma CVD with source gases including hydrogen at a RF power of 0.11 W/cm$^2$–0.85 W/cm$^2$ per unit area of the electrode, the silicon nitride or silicon oxynitride film constituting a first insulating film;

forming a second insulating film made of a different material than that of said first insulating film, on said first insulating film;

selectively removing said second insulating film, to form an aperture in said second insulating film, the aperture exposing said first insulating film;

removing the first insulating film exposed in said aperture, to expose said semiconductor substrate; and forming an electrically conductive layer on said exposed semiconductor substrate.

14. A method according to claim 13, further comprising the step of:

degassing hydrogen from said silicon nitride or silicon oxynitride film.

15. A method according to claim 14, wherein said RF power has a frequency of 13.56 MHz, and said degassing step includes subjecting the semiconductor substrate to a temperature in a range of 500° C.–800° C. in an atmosphere of ozone, nitrogen, argon, or ozone, or to a temperature in a range of 300° C.–550° C. in plasma.

16. A method of manufacturing a semiconductor device comprising the steps of:

(a) forming a MOS transistor structure on a semiconductor substrate, said MOS transistor structure having an insulated gate electrode and a pair of source/drain regions in the semiconductor substrate on both sides of the insulated gate electrode;

(b) depositing a first insulating film covering said insulated gate electrode over said semiconductor substrate, by diode parallel plate electrode plasma CVD using hydrogen-containing source gas under the conditions of a normalized RF power of 0.11 W/cm$^2$ to 0.85 W/cm$^2$ at the parallel plate electrode;

(c) depositing a second insulating film on said first insulating film, the first and second insulating films having different etching characteristics; and (d) etching a hole through the first and second insulating film on at least one of the source/drain regions, using the first insulting film as an etch stopper.

17. A method according to claim 16, wherein said step (c) deposits the second insulating film by plasma CVD with RF power of 0.11 W/cm$^2$ to 0.85 W/cm$^2$.

18. A method according to claim 16, wherein said RF power has a frequency of 13.56 MHz.

19. A method according to claim 16, wherein said step (a) forms a plurality of MOS transistor structures and includes a subsidiary step of doping n-type impurities into ones of said insulated gate electrodes of the MOS transistor structures and a subsidiary step of doping p-type impurities into the others of said insulated gate electrodes.

20. A method according to claim 19, wherein said step (a) includes a subsidiary step of forming insulating side wall spacers on side walls of each of said insulated gate electrodes of the MOS transistor structures and a subsidiary step of forming self-aligned silicide layers on the source/drain regions on both sides of each of said insulated gate electrodes.

21. A method according to claim 16, wherein said first insulating film is made of SiN or SiON.

22. A method according to claim 16, wherein said step (b) includes depositing an SiN film having a refractive index of 1.9 to 2.9 as measured through ellipsometry.

23. A method according to claim 16, further comprising the step of:

(e) degassing hydrogen from said first insulating film after said step (b).

24. A method according to claim 23, wherein said step (e) includes a subsidiary step of thermally processing said semiconductor substrate at a predetermined temperature by rapid thermal annealling (RTA) or in a resistance heating furnace.

25. A method according to claim 24, wherein said predetermined temperature is in a range of 500° C. to 850° C.

26. A method according to claim 24, wherein said thermal processing subsidiary step is performed in an atmosphere of ozone, nitrogen, argon, or oxygen.

27. A method according to claim 23, wherein said step (e) includes a subsidiary step of processing said semiconductor substrate in plasma.

28. A method according to claim 27, wherein said plasma processing subsidiary step is performed while said semiconductor substrate is maintained at 300° C. to 550° C.

29. A method according to claim 27, wherein said plasma processing subsidiary step is performed in an atmosphere of oxygen, nitrogen, dinitrogen monoxide, or argon.

* * * * *